US009864138B2

(12) United States Patent
Coolbaugh et al.

(10) Patent No.: US 9,864,138 B2
(45) Date of Patent: Jan. 9, 2018

(54) INTEGRATED PHOTONICS INCLUDING GERMANIUM

(71) Applicant: The Research Foundation for the State University of New York, Albany, NY (US)

(72) Inventors: Douglas Coolbaugh, Highland, NY (US); Thomas Adam, Slingerlands, NY (US); Gerald L. Leake, Delmar, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 0 days.

(21) Appl. No.: 14/987,693

(22) Filed: Jan. 4, 2016

(65) Prior Publication Data

US 2016/0197111 A1 Jul. 7, 2016

Related U.S. Application Data

(60) Provisional application No. 62/099,848, filed on Jan. 5, 2015.

(51) Int. Cl.
*G02B 6/13* (2006.01)
*H01L 31/105* (2006.01)
(Continued)

(52) U.S. Cl.
CPC .......... *G02B 6/13* (2013.01); *G02B 6/12002* (2013.01); *G02B 6/132* (2013.01); *G02B 6/136* (2013.01); *G02B 6/1347* (2013.01); *H01L 21/0245* (2013.01); *H01L 21/02381* (2013.01); *H01L 21/02532* (2013.01); *H01L 21/2033* (2013.01); *H01L 21/2053* (2013.01);
(Continued)

(58) Field of Classification Search
CPC ............. H01L 31/105; H01L 27/14625; H01L 31/0232; H01L 21/2033; H01L 21/2053; H01L 21/02381; H01L 21/0245; H01L 21/02532; G02B 6/13
See application file for complete search history.

(56) References Cited

U.S. PATENT DOCUMENTS

| | | | |
|---|---|---|---|
| 5,841,931 | A | 11/1998 | Foresi et al. |
| 6,108,464 | A | 8/2000 | Foresi et al. |

(Continued)

FOREIGN PATENT DOCUMENTS

| | | |
|---|---|---|
| CN | 1713401 A | 7/2005 |
| CN | 1728405 A | 2/2006 |

(Continued)

OTHER PUBLICATIONS

International Search Report (ISR) for PCT/US2016/012183 dated Aug. 24, 2016 (3 pages).
(Continued)

*Primary Examiner* — Jose R Diaz
(74) *Attorney, Agent, or Firm* — Heslin Rothenberg Farley & Mesiti, P.C.; George S. Blasiak

(57) ABSTRACT

A photonic structure can include in one aspect one or more waveguides formed by patterning of waveguiding material adapted to propagate light energy. Such waveguiding material may include one or more of silicon (single-, poly-, or non-crystalline) and silicon nitride.

36 Claims, 12 Drawing Sheets

(51) Int. Cl.

| | | |
|---|---|---|
| *H01L 21/02* | (2006.01) | |
| *H01L 27/146* | (2006.01) | |
| *H01L 31/028* | (2006.01) | |
| *H01L 21/203* | (2006.01) | |
| *H01L 21/205* | (2006.01) | |
| *G02B 6/12* | (2006.01) | |
| *G02B 6/132* | (2006.01) | |
| *G02B 6/134* | (2006.01) | |
| *G02B 6/136* | (2006.01) | |
| *H01L 31/0232* | (2014.01) | |

(52) U.S. Cl.
CPC ...... *H01L 27/14625* (2013.01); *H01L 31/028* (2013.01); *H01L 31/0232* (2013.01); *H01L 31/02327* (2013.01); *H01L 31/105* (2013.01); *G02B 2006/121* (2013.01); *G02B 2006/12104* (2013.01); *G02B 2006/12123* (2013.01); *G02B 2006/12169* (2013.01); *H01L 27/14629* (2013.01); *Y02E 10/52* (2013.01); *Y02E 10/547* (2013.01)

(56) References Cited

U.S. PATENT DOCUMENTS

| | | |
|---|---|---|
| 6,621,972 B2 | 9/2003 | Kimerling et al. |
| 6,631,225 B2 | 10/2003 | Lee et al. |
| 6,635,110 B1 | 10/2003 | Luan et al. |
| 6,690,871 B2 | 2/2004 | Lee et al. |
| 6,697,551 B2 | 2/2004 | Lee et al. |
| 6,706,576 B1 | 3/2004 | Ngo et al. |
| 6,812,495 B2 | 11/2004 | Wada et al. |
| 6,850,683 B2 | 2/2005 | Lee et al. |
| 6,879,014 B2 | 4/2005 | Wagner et al. |
| 6,884,636 B2 | 4/2005 | Fiorini et al. |
| 6,887,773 B2 | 5/2005 | Gunn, III et al. |
| 6,927,392 B2 | 8/2005 | Liddiard |
| 6,946,318 B2 | 9/2005 | Wada et al. |
| 7,008,813 B1 | 3/2006 | Lee et al. |
| 7,043,120 B2 | 5/2006 | Wada et al. |
| 7,075,081 B2 | 7/2006 | Fiorini et al. |
| 7,095,010 B2 | 8/2006 | Scherer et al. |
| 7,103,245 B2 | 9/2006 | Lee et al. |
| 7,123,805 B2 | 10/2006 | Sparacin et al. |
| 7,186,611 B2 | 3/2007 | Hsu et al. |
| 7,190,871 B2 | 3/2007 | Lock et al. |
| 7,194,166 B1 | 3/2007 | Gunn, III et al. |
| 7,205,525 B2 | 4/2007 | Yasaitis |
| 7,251,386 B1 | 7/2007 | Dickinson et al. |
| 7,259,031 B1 | 8/2007 | Dickinson et al. |
| 7,262,117 B1 | 8/2007 | Gunn, III et al. |
| 7,266,263 B2 | 9/2007 | Ahn et al. |
| 7,279,682 B2 | 10/2007 | Ouvrier-Buffet et al. |
| 7,305,157 B2 | 12/2007 | Ahn et al. |
| 7,317,242 B2 | 1/2008 | Takizawa |
| 7,320,896 B2 | 1/2008 | Fiorini et al. |
| 7,321,713 B2 | 1/2008 | Akiyama et al. |
| 7,340,709 B1 | 3/2008 | Masini et al. |
| 7,358,527 B1 | 4/2008 | Masini et al. |
| 7,389,029 B2 | 6/2008 | Rahman et al. |
| 7,397,101 B1 | 7/2008 | Masini et al. |
| 7,424,181 B2 | 9/2008 | Haus et al. |
| 7,453,129 B2 | 11/2008 | King et al. |
| 7,453,132 B1 | 11/2008 | Gunn, III et al. |
| 7,459,686 B2 | 12/2008 | Syllaios et al. |
| 7,480,430 B2 | 1/2009 | Saini et al. |
| 7,508,050 B1 | 3/2009 | Pei et al. |
| 7,565,046 B2 | 7/2009 | Feng et al. |
| 7,613,369 B2 | 11/2009 | Witzens et al. |
| 7,616,904 B1 | 11/2009 | Gunn, III et al. |
| 7,651,880 B2 | 1/2010 | Tweet et al. |
| 7,659,627 B2 | 2/2010 | Miyachi et al. |
| 7,700,975 B2 | 4/2010 | Rakshit et al. |
| 7,723,206 B2 | 5/2010 | Miyachi et al. |
| 7,723,754 B2 | 5/2010 | Wada et al. |
| 7,736,734 B2 | 6/2010 | Carothers et al. |
| 7,737,534 B2 | 6/2010 | McLaughlin et al. |
| 7,754,540 B2 | 7/2010 | Vashchenko et al. |
| 7,767,499 B2 | 8/2010 | Herner |
| 7,773,836 B2 | 8/2010 | De Dobbelaere |
| 7,790,495 B2 | 9/2010 | Assefa et al. |
| 7,801,406 B2 | 9/2010 | Pan et al. |
| 7,812,404 B2 | 10/2010 | Herner et al. |
| 7,816,767 B2 | 10/2010 | Pei et al. |
| 7,831,123 B2 | 11/2010 | Sparacin et al. |
| 7,902,620 B2 | 3/2011 | Assefa et al. |
| 7,906,825 B2 | 3/2011 | Tweet et al. |
| 7,916,377 B2 | 3/2011 | Witzens et al. |
| 7,943,471 B1 | 5/2011 | Bauer et al. |
| 7,961,992 B2 | 6/2011 | De Dobbelaere et al. |
| 7,973,377 B2 | 7/2011 | King et al. |
| 7,994,066 B1 | 8/2011 | Capellini et al. |
| 7,999,344 B2 | 8/2011 | Assefa et al. |
| 8,030,668 B2 | 10/2011 | Hisamoto et al. |
| 8,121,447 B2 | 2/2012 | De Dobbelaere et al. |
| 8,165,431 B2 | 4/2012 | De Dobbelaere et al. |
| 8,168,939 B2 | 5/2012 | Mack et al. |
| 8,178,382 B2 | 5/2012 | Assefa et al. |
| 8,188,512 B2 | 5/2012 | Kim et al. |
| 8,227,787 B2 | 7/2012 | Kumar et al. |
| 8,238,014 B2 | 8/2012 | Kucharski et al. |
| 8,289,067 B2 | 10/2012 | Kucharski et al. |
| 8,304,272 B2 | 11/2012 | Assefa et al. |
| 8,343,792 B2 | 1/2013 | Carothers et al. |
| 8,354,282 B2 | 1/2013 | Stern |
| 8,358,940 B2 | 1/2013 | Kucharski et al. |
| 8,399,949 B2 | 3/2013 | Meade |
| 8,440,989 B2 | 5/2013 | Mack et al. |
| 8,455,292 B2 | 6/2013 | Assefa et al. |
| 8,471,639 B2 | 6/2013 | Welch |
| 8,577,191 B2 | 11/2013 | De Dobbelaere et al. |
| 8,592,745 B2 | 11/2013 | Masini et al. |
| 8,604,866 B2 | 12/2013 | Kucharski et al. |
| 8,614,116 B2 | 12/2013 | Assefa et al. |
| 8,625,935 B2 | 1/2014 | Mekis et al. |
| 8,626,002 B2 | 1/2014 | Kucharski et al. |
| 8,633,067 B2 | 1/2014 | Assefa et al. |
| 8,649,639 B2 | 2/2014 | Mekis et al. |
| 8,664,739 B2 | 3/2014 | King et al. |
| 8,665,508 B2 | 3/2014 | Kucharski et al. |
| RE44,829 E | 4/2014 | De Dobbelaere et al. |
| 8,698,271 B2 | 4/2014 | Suh et al. |
| 8,742,398 B2 | 6/2014 | Klem et al. |
| 8,754,711 B2 | 6/2014 | Welch |
| 8,772,704 B2 | 7/2014 | Mack et al. |
| 8,787,774 B2 | 7/2014 | Guckenberger |
| 8,798,476 B2 | 8/2014 | Gloeckner et al. |
| RE45,214 E | 10/2014 | De Dobbelaere et al. |
| RE45,215 E | 10/2014 | De Dobbelaere et al. |
| 8,877,616 B2 | 11/2014 | Pinguet et al. |
| 8,895,413 B2 | 11/2014 | Pinguet et al. |
| 8,923,664 B2 | 12/2014 | Mekis et al. |
| RE45,390 E | 2/2015 | De Dobbelaere et al. |
| 9,046,650 B2 | 6/2015 | Lin et al. |
| 9,053,980 B2 | 6/2015 | Pinguet et al. |
| 9,091,827 B2 | 7/2015 | Verslegers et al. |
| 9,110,221 B2 | 8/2015 | Agarwal et al. |
| 2003/0215203 A1 | 11/2003 | Lock et al. |
| 2004/0057684 A1 | 3/2004 | Kokubun et al. |
| 2005/0012040 A1 | 1/2005 | Fiorini et al. |
| 2005/0051705 A1 | 3/2005 | Yasaitis |
| 2005/0101084 A1 | 5/2005 | Gilton |
| 2005/0111806 A1 | 5/2005 | Brask et al. |
| 2005/0205954 A1 | 9/2005 | King et al. |
| 2006/0110844 A1 | 5/2006 | Lee et al. |
| 2006/0194357 A1 | 8/2006 | Hsu et al. |
| 2006/0243973 A1 | 11/2006 | Gilton |
| 2006/0249753 A1 | 11/2006 | Herner |
| 2006/0250836 A1 | 11/2006 | Herner et al. |
| 2006/0250837 A1 | 11/2006 | Herner |
| 2006/0289764 A1 | 12/2006 | Fiorini et al. |
| 2007/0034978 A1 | 2/2007 | Pralle et al. |
| 2007/0099329 A1 | 5/2007 | Maa et al. |

(56) References Cited

U.S. PATENT DOCUMENTS

| | | |
|---|---|---|
| 2007/0104410 A1 | 5/2007 | Ahn et al. |
| 2007/0141744 A1 | 6/2007 | Lee et al. |
| 2007/0170536 A1 | 7/2007 | Hsu et al. |
| 2007/0190722 A1 | 8/2007 | Herner |
| 2007/0228414 A1 | 10/2007 | Kumar et al. |
| 2007/0246764 A1 | 10/2007 | Herner |
| 2007/0262296 A1 | 11/2007 | Bauer |
| 2008/0121805 A1 | 5/2008 | Tweet et al. |
| 2008/0157253 A1 | 7/2008 | Starikov et al. |
| 2008/0217651 A1 | 9/2008 | Liu et al. |
| 2008/0239787 A1 | 10/2008 | Herner |
| 2008/0311696 A1 | 12/2008 | Chee-Wee et al. |
| 2008/0316795 A1 | 12/2008 | Herner |
| 2008/0318397 A1 | 12/2008 | Herner |
| 2009/0032814 A1 | 2/2009 | Vashchenko et al. |
| 2009/0196631 A1 | 8/2009 | Daghighian et al. |
| 2010/0006961 A1* | 1/2010 | Yasaitis ............... H01L 27/1443 257/431 |
| 2010/0031992 A1 | 2/2010 | Hsu |
| 2010/0090110 A1 | 4/2010 | Tweet et al. |
| 2010/0102412 A1 | 4/2010 | Suh et al. |
| 2010/0133536 A1 | 6/2010 | Syllaios et al. |
| 2010/0133585 A1 | 6/2010 | Kim et al. |
| 2010/0151619 A1 | 6/2010 | Yasaitis |
| 2010/0213561 A1 | 8/2010 | Assefa et al. |
| 2010/0276776 A1 | 11/2010 | Lee et al. |
| 2010/0302836 A1 | 12/2010 | Herner |
| 2011/0012221 A1 | 1/2011 | Fukikata et al. |
| 2011/0027950 A1 | 2/2011 | Jones et al. |
| 2011/0156183 A1 | 6/2011 | Liu |
| 2011/0163404 A1 | 7/2011 | Lee et al. |
| 2011/0227116 A1 | 9/2011 | Saito et al. |
| 2012/0001283 A1 | 1/2012 | Assefa et al. |
| 2012/0025212 A1 | 2/2012 | Kouvetakis et al. |
| 2012/0129302 A1 | 5/2012 | Assefa et al. |
| 2012/0187280 A1 | 7/2012 | Kerness et al. |
| 2012/0193636 A1 | 8/2012 | Stern |
| 2012/0288971 A1* | 11/2012 | Bogaerts ............... H01L 31/105 438/24 |
| 2012/0288992 A1 | 11/2012 | Assefa et al. |
| 2012/0299143 A1 | 11/2012 | Stern |
| 2013/0065349 A1 | 3/2013 | Assefa et al. |
| 2013/0154042 A1 | 6/2013 | Meade |
| 2013/0202005 A1 | 8/2013 | Dutt |
| 2013/0214160 A1 | 8/2013 | Cazaux et al. |
| 2013/0228886 A1 | 9/2013 | JangJian et al. |
| 2013/0284889 A1 | 10/2013 | Giffard et al. |
| 2013/0313579 A1 | 11/2013 | Kouvetakis et al. |
| 2013/0328145 A1 | 12/2013 | Liu et al. |
| 2014/0008750 A1 | 1/2014 | Feshali et al. |
| 2014/0027826 A1 | 1/2014 | Assefa et al. |
| 2014/0029892 A1 | 1/2014 | Pomerene et al. |
| 2014/0080269 A1 | 3/2014 | Assefa et al. |
| 2014/0124669 A1 | 5/2014 | Zheng et al. |
| 2014/0131733 A1 | 5/2014 | Meade |
| 2014/0134789 A1 | 5/2014 | Assefa et al. |
| 2014/0134790 A1 | 5/2014 | Assefa et al. |
| 2014/0159129 A1 | 6/2014 | Wang et al. |
| 2014/0175510 A1 | 6/2014 | Suh et al. |
| 2014/0203325 A1 | 7/2014 | Verma et al. |
| 2014/0209985 A1 | 7/2014 | Assefa et al. |

FOREIGN PATENT DOCUMENTS

| | | |
|---|---|---|
| CN | 2826699 Y | 10/2006 |
| CN | 100372128 C | 2/2008 |
| CN | 100372129 C | 2/2008 |
| CN | 100385686 C | 4/2008 |
| CN | 101423907 B | 12/2010 |
| CN | 102124311 A | 7/2011 |
| CN | 102693988 A | 9/2012 |
| CN | 102683168 B | 10/2015 |
| CN | 103928562 B | 1/2016 |
| CN | 103762255 B | 3/2016 |
| CN | 102986041 B | 4/2016 |
| DE | 102012001070 A1 | 7/2012 |
| DE | 11201110241 B4 | 10/2013 |
| DE | 102013201644 A1 | 3/2014 |
| EP | 1215733 B1 | 12/2001 |
| EP | 1685701 B1 | 10/2004 |
| EP | 2523026 A1 | 5/2012 |
| FR | 2885690 B1 | 6/2007 |
| FR | 2990565 A1 | 11/2013 |
| GB | 2489924 A | 10/2012 |
| GB | 2495437 B | 7/2014 |
| JP | 2004537159 A | 12/2004 |
| JP | 2005523438 A | 8/2005 |
| JP | 2006148076 A | 6/2006 |
| JP | 2010045313 A | 2/2010 |
| JP | 2010212469 A | 9/2010 |
| JP | 2012256869 A | 12/2012 |
| JP | 2013529854 A | 7/2013 |
| JP | 5370857 B2 | 12/2013 |
| JP | 5404858 B2 | 2/2014 |
| KR | 1020060125744 A | 12/2006 |
| KR | 1020080031668 A | 4/2008 |
| KR | 1020100046381 A | 5/2010 |
| KR | 1020100063607 A | 6/2010 |
| KR | 10201000941 B1 | 12/2010 |
| KR | 1020120087189 A | 8/2012 |
| KR | 101213228 B1 | 12/2012 |
| KR | 101335383 B1 | 11/2013 |
| KR | 1020140025265 A | 3/2014 |
| KR | 1020140025270 A | 3/2014 |
| RU | 2308788 C1 | 10/2007 |
| RU | 121102 U1 | 10/2012 |
| RU | 2488916 C1 | 7/2013 |
| TW | 200901331 A | 1/2009 |
| TW | 200916680 A | 4/2009 |
| TW | 201214720 A | 4/2012 |
| WO | WO 2005079199 A2 | 9/2005 |
| WO | WO 2005104147 A2 | 11/2005 |
| WO | WO 2006007446 A2 | 1/2006 |
| WO | WO 2009052479 A2 | 4/2009 |
| WO | WO 2010033641 A1 | 3/2010 |
| WO | WO 2012000849 A2 | 1/2012 |
| WO | WO 2012068451 A2 | 5/2012 |
| WO | WO 2014044771 A2 | 3/2014 |
| WO | WO 2014080021 A2 | 5/2014 |

OTHER PUBLICATIONS

Written Opinion for PCT/US2016/012183 dated Aug. 24, 2016 (13 pages).

D. Coolbaugh, et al. "*Integrated Silicon Photonics Fabrication on a 300mm Platform,*" Chip Scale Review, vol. 17 No. 3, p. 20-23, May/Jun. 2013 (5 pages).

Restriction Requirement for U.S. Appl. No. 14/987,710, dated Jan. 18, 2017.

Applicant's Response to Restriction Requirement for U.S. Appl. No. 14/987,710, filed Mar. 20, 2017.

Non-Final Office action for U.S. Appl. No. 14/987,710, dated Jun. 23, 2017.

Response to Non-Final Office action for U.S. Appl. No. 14/987,710, dated Oct. 23, 2017.

* cited by examiner

INTEGRATED PHOTONICS INCLUDING GERMANIUM

CROSS REFERENCE TO RELATED APPLICATIONS

This application claims the benefit of priority of U.S. Provisional App. No. 62/099,848 filed Jan. 5, 2015 entitled "INTEGRATED PHOTONICS PROCESS ON SOI WAFER" which is incorporated herein by reference in its entirety. U.S. patent application Ser. No. 14/987,710 filed Jan. 4, 2016 entitled "INTEGRATED PHOTONICS INCLUDING WAVEGUIDING MATERIAL" is incorporated herein by reference in its entirety.

GOVERNMENT RIGHTS STATEMENT

This invention was made with government support under Defense Advanced Research Projects Agency (DARPA) of the United States, under grant contract number HR0011-12-2-0007. The government may have certain rights in the invention.

FIELD

The present disclosure relates to photonics generally and specifically to photonic structures and processes for fabrication.

BACKGROUND

Commercially available photonic integrated circuits are fabricated on wafers, such as bulk silicon or silicon-on-insulator wafers.

In one aspect photonics integrated circuits can include waveguides for transmission of optical signals between different areas of a photonic integrated circuit chip as well as on and off the chip. Commercially available waveguides are of rectangular or ridge geometry and are fabricated in silicon (single or polycrystalline) or silicon nitride.

Commercially available photonics integrated circuits can include photodetectors and other optical components. Photonic integrated circuits rely on the emission, modulation and the detection of light in the communication band (about 1.3 μm to about 1.55 μm). A bandgap absorption edge in germanium is near 1.58 μm. Germanium has been observed to provide sufficient photo-response for optoelectronic applications using 1.3 μm and 1.55 μm carrier wavelengths.

BRIEF DESCRIPTION

The shortcomings of the prior art are overcome, and additional advantages are provided, through the provision, in one aspect, of a photonic structure.

A photonic structure can include in one aspect one or more waveguides formed by patterning of waveguiding material adapted to propagate light energy. Such waveguiding material may include one or more of silicon (single-, poly-, or non-crystalline) or silicon nitride.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Figure 1:
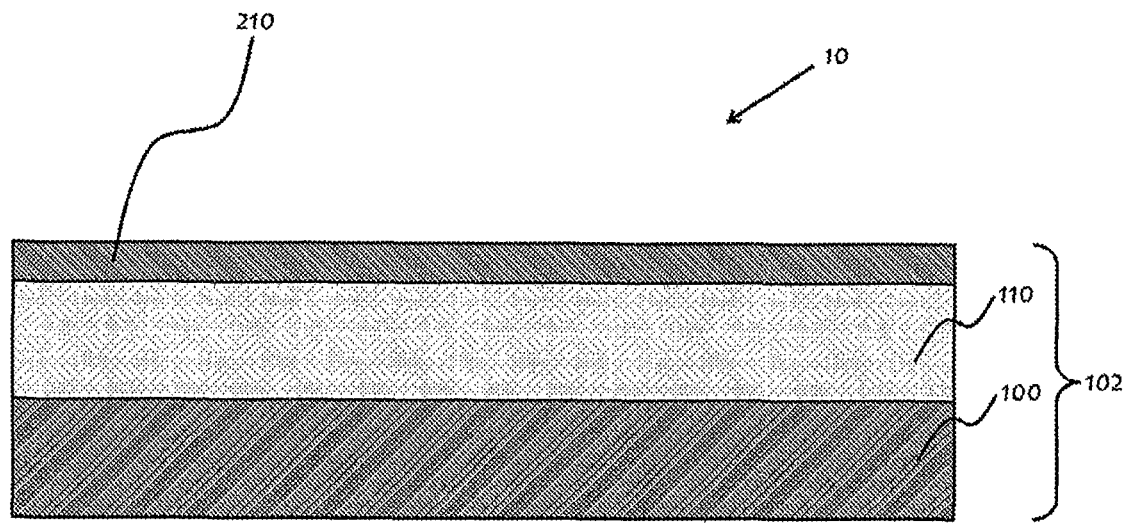
FIG. 1 is a cross sectional view of a wafer pre-constructed for the fabrication of photonic structures.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

A photonic structure can include in one aspect one or more waveguides formed by patterning of waveguiding material adapted to propagate light energy. Such waveguiding material may include one or more of silicon (single-, poly-, or non-crystalline) and silicon nitride. Additional dielectric material over the one or more waveguides may serve as cladding and separation material.

In one embodiment, one or more photosensitive detectors fabricated from embedded epitaxial germanium may be included in the photonic structure to allow high-speed and efficient detection of optical signals.

In one embodiment, a pre-constructed wafer can be used for the fabrication of the disclosed photonic structure.

In one embodiment, there is set forth herein a photonic structure fabricated using one or more layers formed of hardmask material. The one or more layers of hardmask material allow for in-situ and ex-situ cleaning of residue generated by dry-etching equipment, and concurrently preventing the consumption of material from a waveguiding layer during fabrication.

In one embodiment, a photonic structure can include waveguides of one or more geometries (for example, rectangular or ridge-type) and one or more different sizes-patterned using a single layer of waveguiding material or distributed over multiple levels of similar or dissimilar waveguiding material layers. Waveguiding layers herein can be regarded as photonic layers.

In one embodiment, the fabrication processes can include forming a cladding layer using non-conformal materials over one or more formed waveguide employing high-aspect-ratio processing (HARP). Non-conformality may be achieved using plasma enhancements during the deposition process, with conditions tuned to enhance deposition rates on horizontal surfaces while suppressing deposition rates on vertical surfaces (at step edges). Thus, voids and other defects resulting from pinch off of a cladding layer can be avoided, and detrimental effects of the same on optical properties can be minimized.

In one embodiment, a photonic structure can be fabricated to include one or more nitride waveguides using high-quality low-thermal-budget plasma-enhanced chemical vapor deposition (PECVD).

In one embodiment, a photonic structure can be fabricated to include one or more poly-crystalline or amorphous waveguides using chemical vapor deposition from various precursors (for example, silane for poly-crystalline, and disilane for amorphous).

In one embodiment, a photonic structure can include waveguides patterned from one or more waveguiding layers of dissimilar waveguiding material. The waveguiding materials of the different layers may also include a combination of common and dissimilar materials. A dielectric layer can separate the different waveguiding layers. Where a photonic structure includes a plurality of waveguiding layers, the plurality of waveguiding layers can be provided at a common elevation or at different elevations.

In one embodiment, a photonic structure can include a photodetector formed of germanium adjacent to a silicon layer. In particular, this disclosure describes a method that eliminates the need for low-temperature buffer layers between the germanium formation and the layer formed of silicon. In one embodiment, the germanium photodetector material can be formed using a process wherein volumes of germanium are iteratively deposited and in-situ annealed.

In one embodiment, the disclosed photodetector includes a via top contact arrangement wherein a spacing distance between a germanium formation perimeter (in contact with trench oxide) and an ion implantation region perimeter can be equal to or greater than a threshold distance. In another aspect a spacing distance between an ion implantation region perimeter and a contact perimeter can be equal to or greater than a threshold distance. Providing a photodetector to include a substantial trench to ion implantation region distance and trench to contact distance can avoid formation of leakage paths about a formed photodetector.

In one embodiment a top most contact wiring layer of a fabricated photodetector can be formed of an appropriate metal contact. The termination wiring layer formed of an appropriate metal contact can be adapted to accommodate wiring bonds and allow for improved temperature-dependent operation.

In one embodiment, a dual damascene process can be employed for fabrication of a wiring layer, where connecting vias and wiring trenches are produced in separate patterning steps, but filled with a conductive metal material and planarized with a common deposition and planarization process.

In one embodiment, a method of fabricating a photonic structure can include forming a layer of dielectric material over a waveguide, etching a trench in the layer of the dielectric material, epitaxially growing germanium within the trench, annealing germanium formed by the epitaxially growing, repeating the epitaxially growing and annealing until formed germanium sufficiently overfills the trench, and planarizing a portion of the germanium that overfills the trench. Processes for fabrication of n and p regions, contact interfaces, and contacts can be performed to define a photonic structure having a photodetector.

Epitaxially grown and annealed germanium may contain doped or undoped portions. Where a semiconductor structure includes intrinsic germanium, a semiconductor structure can define a p-i-n or n-i-p photodetector structure by in-situ doping or other ion-implantation methods. In one embodiment, a vertical photodetector can be formed on a silicon-on-insulator (SOI) wafer, wherein a top silicon layer of the SOI wafer can be etched to define a silicon waveguide. In one aspect a formed photodetector can include germanium and silicon and can be absent a low-temperature silicon germanium (SiGe) or Ge buffer between the silicon and the germanium.

In one aspect, a photonic structure and method of fabrication can be provided wherein waveguides of different geometries can be fabricated over a thick buried-oxide (BOX) silicon-on-insulator (SOI) wafer. In one embodiment, waveguides of different geometries and/or sizes can be fabricated by patterning of a layer of waveguiding material. In one embodiment, waveguides of different geometries and/or sizes can be fabricated by patterning of a layer of waveguiding material where the layer of waveguiding material can be provided by a top layer of a SOI wafer. In one embodiment, there can be used one or more layer of hardmask material e.g. silicon dioxide ($SiO_2$) for fabrication of waveguides.

Referring to FIG. 1 there is shown a pre-constructed silicon on insulator (SOI) wafer 102 appropriate for the fabrication of photonic structures. SOI wafer 102 can include a substrate 100 formed of silicon, a layer 110 formed of a dielectric material, e.g. oxide and layer 210 formed of silicon. SOI wafer 102 can be a photonics modified SOI wafer having layer 110 which can be a thickened oxide layer for suppressing propagation losses in substrate 100. Layer 110 in one embodiment can include a thickness of between about 1 µm and about 4 µm. Layer 210 of a photonic optimized SOI wafer in one embodiment can be formed of intrinsic (undoped) or lightly-doped crystalline silicon. Layer 110 and layer 210 of SOI wafer 102 can be fabricated e.g. by wafer bonding or implantation of oxygen followed by annealing.

Further referring to FIG. 1, the top silicon layer 210 can be tailored to the thickness desired by photonics design e.g. by epitaxial growth (thickening), or chemical etching or oxidation and oxide removal (thinning).

In one aspect, photonic structure 10 can include formed waveguides of one or more different geometries and/or one or more different sizes. In reference to FIGS. 1-12 there is described fabrication of a photonic structure 10 in one particular embodiment wherein waveguides e.g. waveguides 2101, 2102 and 2103 of multiple geometries and multiple minimal thicknesses can be fabricated from a single layer of silicon, e.g. layer 210. In one embodiment, layer 210 can be provided by a top layer of SOI wafer 102 formed of silicon.

A method of fabrication of a photonic structure having one or more waveguide is described with reference to FIGS. 1-12.

Referring to FIG. 1 there is shown a SOI wafer 102 having a layer 100 provided by silicon substrate, layer 110 which can be provided by buried oxide (BOX), and layer 210 which can be provided by intrinsic (undoped) or lightly-doped silicon.

Figure 2:
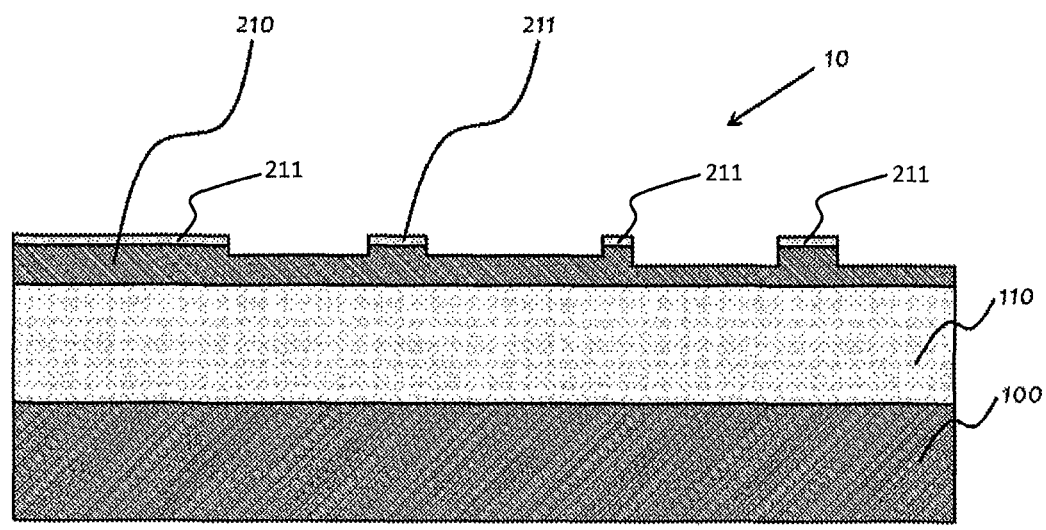
FIG. 2 is a cross sectional view of the photonic structure in an intermediary stage of fabrication after pattering of multiple exemplary ridge-type waveguides using a first set of hardmask materials.

FIG. 2 illustrates an exemplary photonic structure 10 having a layer 210 which can be regarded as a waveguiding layer and patterning for fabrication of multiple single-crystalline silicon waveguides. The figure depicts photonic structure 10 after multiple patterning and partial etching of waveguiding layer 210 which can be formed of silicon, as well as removal of a softmask material, achieved using layer 211 which can be a thin layer formed of first hardmask material. Layer 211 can assist in maintaining the lithography feature definition, preventing attack of the remaining full-height silicon of waveguiding layer 210 during the etch process, and can allow for sufficient removal of dry-etching residue in both in-situ and ex-situ cleaning. Not shown here are intermediate steps, such as lithography and softmask patterning.

Figure 3:
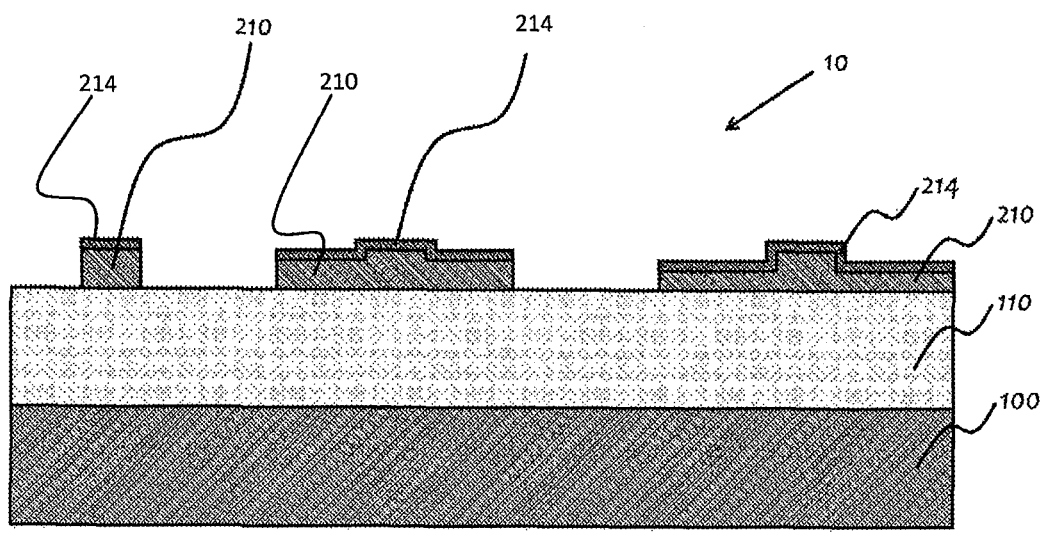
FIG. 3 is a cross sectional view of a photonic structure in an intermediary stage of fabrication after formation of multiple exemplary geometries of waveguides (rectangular and ridge) using a second set of hardmask materials.

Similar to FIG. 2, FIG. 3 illustrates a second exemplary photonic structure 10 consisting of multiple types of single-crystalline silicon waveguides. The figure depicts photonic structure 10 after patterning and complete etching of waveguiding layer 210 which can be formed of silicon, as well as removal of the softmask (e.g. organic stack) material, achieved using a layer 214 which can be a thin layer formed of second hardmask material. Layer 214 which can be hardmask material can also assist in maintaining the lithography feature definition, preventing attack of the top surface of waveguiding layer 210 during the etch process, and can allow for sufficient removal of dry-etching residue in both in-situ and ex-situ cleaning. Also, not shown here are intermediate steps, such as lithography and softmask patterning.

Use of one or more of layer 211 or layer 214 which can be formed of hardmask material can reduce defects in fabricated waveguides. It was observed that reactive ion etching (RIE) can result in polymer residue formations on sidewalls of softmasks, hardmasks, and final features. It was further observed that cleaning of polymer residue formations without layers 211 and 214, can introduce abnormal surface defects into waveguiding layer 210 defining formed waveguides by micro-masking in further processing. In addition, polymer residue embedded between waveguiding layer 210 formed of silicon and layer 120 formed of oxide (FIG. 4) can introduce a substantial increase in propagation loss in the communications band (about 1.3 µm to about 1.55 µm). Use of one or more of layer 211 or layer 214 can protect waveguiding layer 210 from damage (e.g. via silicon consumption) when cleaning processes are performed for removal of polymer residue formations. In another aspect layers 211 and 214 formed of hardmask material can serve as a screening layer for ion implantation for formation e.g. of contacts, sub-contacts, photonics or CMOS junctions. Regarding patterning of waveguiding layer 210, patterning of waveguiding layer 210 can be performed using a stack of organic lithography material (a mask) formed over one or more or layer 211 or layer 214. There is set forth herein a method including forming a stack of hardmask material over a layer of waveguiding material; depositing a stack of softmask material formed of organic lithography material over the stack of hardmask material; and patterning the stack of organic lithography material, wherein the patterning includes stopping at the stack of hardmask material. One or more of layer 211 or layer 214 as set forth herein can be formed of hardmask material, e.g., silicon dioxide ($SiO_2$).

Figure 4:
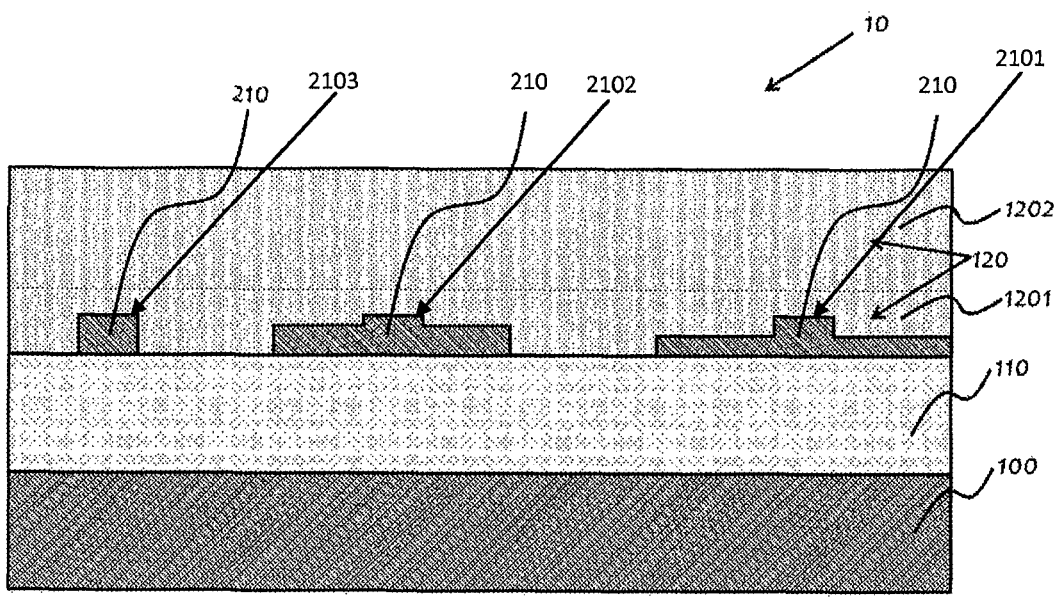
FIG. 4 is a cross sectional view of a photonic structure in an intermediary stage of fabrication after removal of hardmask/softmask materials and deposition, planarization, and encapsulation using low-temperature oxide.

Referring to FIG. 4, high aspect ratio processing (HARP) or other low loss dielectric such as plasma enhanced chemical vapor deposition (PECVD) TEOS can be performed for the formation of a layer of dielectric material that surrounds a fabricated waveguide. Layer 1201 can be formed about waveguides 2101, 2102, and 2103 defined by waveguiding layer 210. In one embodiment, layer 1201 can be formed of a non-conformal oxide material. Use of a non-conformal oxide material for layer 1201 can reduce an incidence of voids and other defects in oxide that surrounds waveguides 2101, 2102, and 2103. A non-conformal oxide material can be a material that is adapted to deposit at a higher rate on horizontal surfaces while exhibiting a suppressed sidewall deposition rate. In one embodiment of a method for providing non-conformal oxide material, a deposition of oxide material can be plasma enhanced. It can be envisioned (but is not depicted) that with use of conformal material for layer

1201, pinch off can occur when layer 1201 is deposited over high aspect ratio features and accordingly can result in introduction of voids with oxide surrounding waveguides 2101, 2102, and 2103.

Further referring to FIG. 4, the photonic structure 10 is shown after planarization of a dielectric layer 1201 and capping with a dielectric layer 1202 for providing the correct total thickness of dielectric material of layer 120 for further processing. On planarization of layer 1201 a top elevation of layer 1201 can be reduced. On planarization of layer 1202 a top elevation of layer 1202 can be reduced.

With use of the fabrication stages described with reference to FIGS. 1-12, waveguides of multiple different geometries and multiple minimal heights can be defined by layer 210 of SOI wafer 102. Waveguide 2101 can be a ridge waveguide having first minimal thickness. Waveguide 2102 can be a ridge waveguide having a second minimal thickness greater than the first minimal thickness. Waveguide 2103 can be a rectangular waveguide having a third minimal thickness greater than the second minimal thickness.

Figure 5:
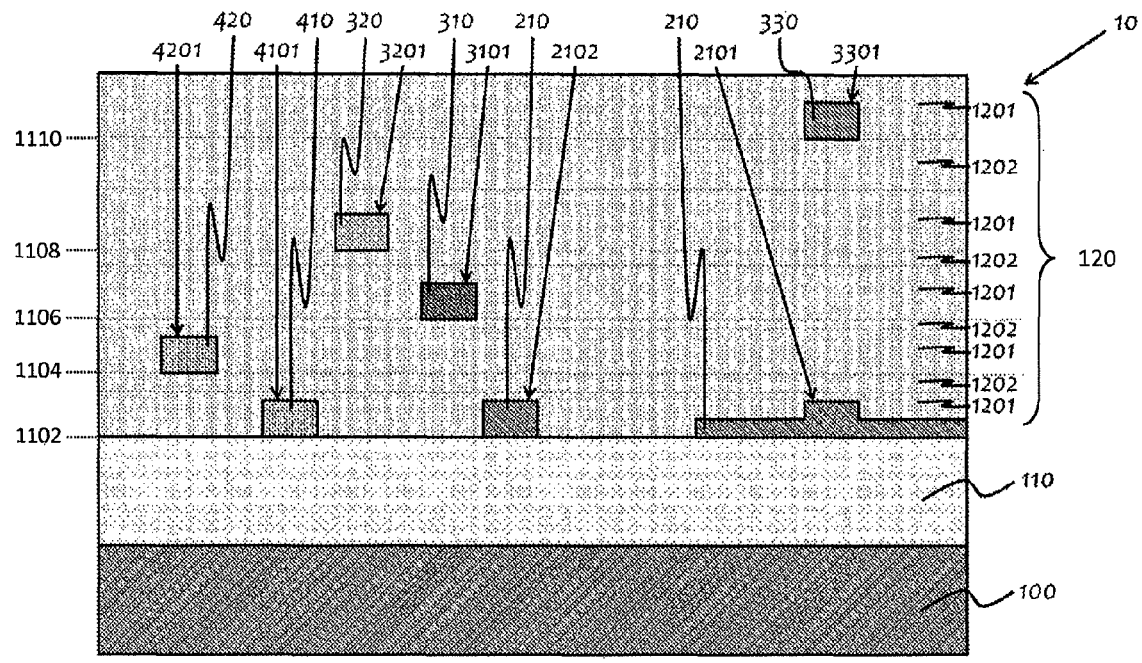
FIG. 5 is a cross sectional view of an exemplary photonic structure having multiple-geometry waveguides formed at multiple elevations.

Referring to FIG. 5. photonic structure 10 in one embodiment can include waveguides defined in multiple layers of common or dissimilar material. Exemplary photonic structures 10 as set forth herein can include one to four or more levels of waveguiding layers with one to two or more waveguiding materials in each level. Waveguides fabricated of different materials within a photonic structure 10 can be used for the performance of different functions. For example, silicon is easily adapted for conducting electrical current and accordingly waveguides formed of silicon can be used to include active devices such as photodetectors and other photonic components. Dielectric waveguides (such as silicon nitride) can be adapted for transmission of light waves over longer distances owing to a reduced figure of absorption in the communications wavelength range. Waveguides fabricated of other materials such as amorphous silicon or polycrystalline silicon can have a balance of electrical and optical properties and can be particularly useful for functions having a balance of current conduction and distance light transmission aspects.

To aid in the fabrication of a photonic structure 10 having waveguides defined by different waveguiding layers, photonic structure 10 can include layers in the form of one or more dielectric separating layers in the form of films between layers of different material.

Referring to FIG. 5 dielectric layer 1201 which can be regarded as a cladding layer can be a gap-filling cladding oxide that can be planarized by the application of a polishing process, while capping layer 1202 can be a second distance correcting low temperature oxide film. There can be provided a dielectric layer in the form of capping layer 1202 above the dielectric layer 1201 to provide corrected dielectric separation distance to one or more additional waveguiding layer.

In one embodiment, capping layer 1202 can be designed to enhance the fabrication and the operation of one or more additional waveguides defined within a waveguiding layer formed of waveguiding material formed above a waveguiding layer 210 formed of waveguiding material defining one or more base waveguides. Where capping layer 1202 supports one or more device layer above layer 1202, layer 1202 can be regarded as a dielectric separation layer of compatible optical properties. Layer 1202 can provide physical and optical isolation between waveguiding layers e.g., waveguiding layer 210 and waveguiding layer 310 in which waveguides can be defined. Layer 1202 can provide a separation between waveguiding layers that can be tailored for isolation or intentional optical coupling. Layer 1202 can provide corrected dielectric separation distance between waveguiding layers. Material of layer 1202 can be selected to provide low propagation loss and optimize process compatibility, especially with regard to temperature.

Further referring to FIG. 5, an exemplary fabricated photonic structure 10 wherein the photonic structure 10 includes multiple waveguides is illustrated. Layer 120 can be formed of dielectric material and can include in the specific embodiment layer 1201 formed of dielectric material surrounding waveguides (e.g. waveguide 2101 and waveguide 2102) defined by waveguiding layer 210 and waveguiding layer 410 (e.g. waveguide 4101) and layer 1202 serving as dielectric capping layer formed on the cladding layer 1201 surrounding waveguides defined by waveguiding layer 210 and waveguiding layer 410. Layer 120 in the embodiment of FIG. 5 can further include layer 1201 formed of dielectric material surrounding waveguides defined by layer 420 (e.g. waveguide 4201) and layer 1202 serving as an dielectric capping layer formed on the layer 1201 surrounding waveguides defined by waveguiding layer 420. Layer 120 in the embodiment of FIG. 5 can further include layer 1201 formed of dielectric material surrounding waveguides (e.g. waveguide 3101) defined by waveguiding layer 310, and layer 1202 serving as an dielectric capping layer formed on the layer 1201 surrounding waveguides defined by waveguiding layer 310. Layer 120 in the embodiment of FIG. 5 can further include layer 1201 formed of dielectric material surrounding waveguides defined by waveguiding layer 320 (e.g. waveguide 3201), and layer 1202 serving as a dielectric capping layer formed on the layer 1201 surrounding waveguides defined by waveguiding layer 320. Layer 120 in the embodiment of FIG. 5 can further include layer 1201 formed of dielectric material surrounding waveguides defined by waveguiding layer 330 (e.g. waveguide 3301), and layer 1202 serving as a dielectric capping layer formed on the layer 1201 surrounding waveguides defined by waveguiding layer 330. Layers 1201 can be regarded as cladding layers and layers 1202 can be regarded as capping layers. Layers 1201 and layers 1202 can be formed of dielectric material e.g. oxide.

Referring to FIG. 5, waveguides 2101 and 2102, waveguides 3101, 3201, and 3301, and waveguides 4101 and 4201 can be encapsulated within layer 120. Referring to FIG. 5, a bottom of waveguide 2101 and waveguide 2103 can be formed at elevation 1102, a bottom of waveguide 4201 can be formed at elevation 1104, a bottom of waveguide 3101 and waveguide 3201 can be formed at elevation 1106 and 1108, respectively. A bottom of waveguide 3301 can be formed at elevation 1110. Waveguides of the photonic structure 10 as set forth in FIG. 5 can be formed of different materials. Waveguide 2101 and waveguide 2102 can be formed of single-crystalline silicon, and waveguide 3101, 3201, and 3301 can be formed of silicon nitride. Waveguides 4101 and 4201 can be formed of amorphous or polycrystalline silicon. Waveguides of photonic structure 10 can have different geometries. Waveguide 2101 as shown in FIG. 5 can have a ridge geometry. Waveguides 2102, 4101, 4201, 3201, 3301 can have rectangular geometries.

In reference to FIG. 5 there is set forth a photonic structure 10 having photonic layer 210, photonic layer 420, photonic layer 310, and photonic layer 320. In one embodiment, the layers 210, 420, 310, and 320 can be regarded as first, second, third and fourth photonic layers. In one embodiment, each of the layers 210, 420, 310, and 320 can be formed at a different elevation. Photonic structure 10 can include less than or greater than the noted number of photonic layers. In one embodiment as set forth in FIG. 5, photonic structure 10 can include photonic layer 330 at an elevation different than an elevation of each of layers 210, 420, 310, and 320. Photonic layer 330 can be regarded as a fifth photonic layer.

Figure 6:
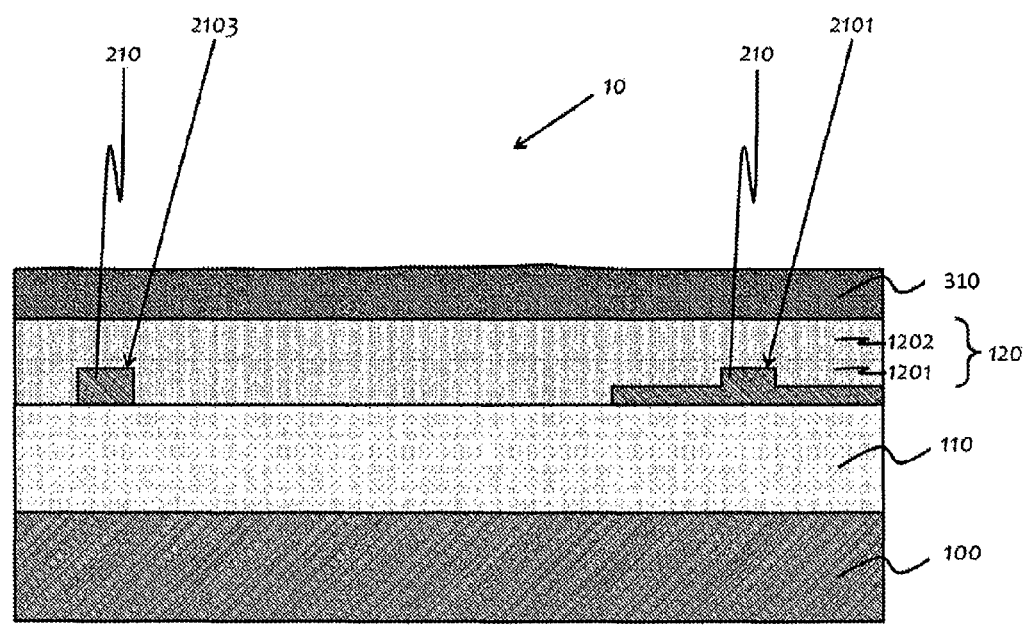
FIG. 6 is a cross sectional view of a photonic structure after deposition of a second waveguiding layer over a first waveguiding layer.

Referring to FIG. 6 through FIG. 10, exemplary fabrication of different waveguides of photonic structure 10 having characteristics of the photonic structure 10 are shown. Referring to FIG. 6, photonic structure 10 can include waveguide 2101, waveguide 2103 and layer 120 formed over waveguide 2101 and waveguide 2103 wherein layer 120 can be formed of a dielectric, e.g., oxide material. Layer 120 in one embodiment can include a combination of layer 1201 which can be regarded as a cladding layer and layer 1202 which can be regarded as a capping layer as set forth herein. Waveguide 2101 and waveguide 2103 can be patterned in and defined by common waveguiding layer 210.

Figure 7:
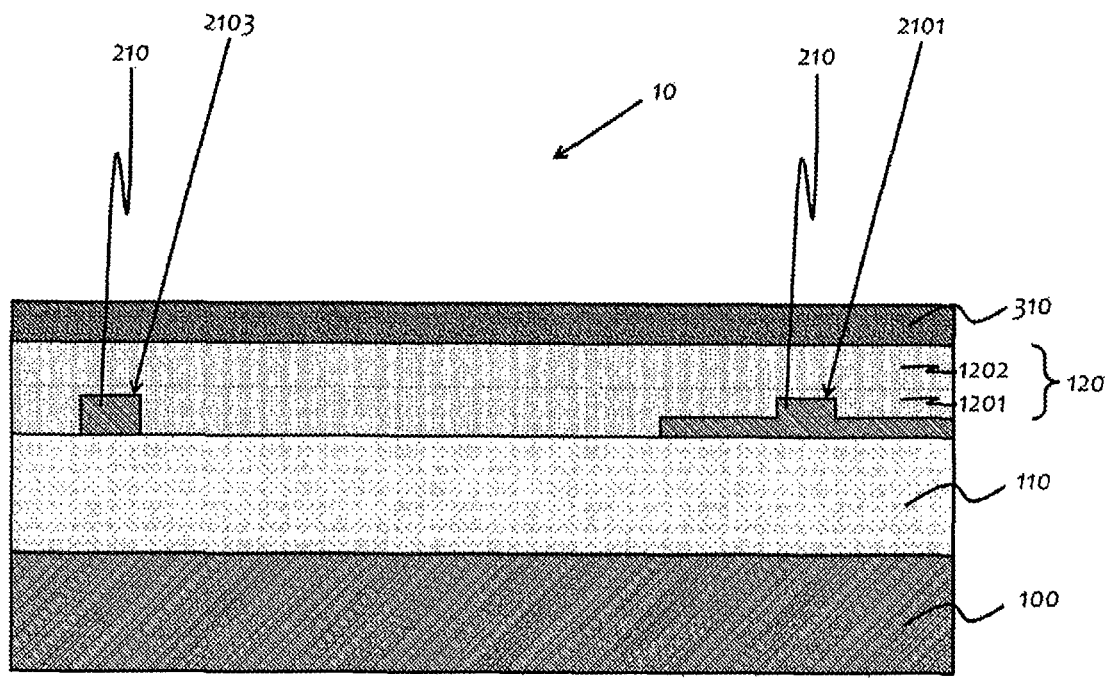
FIG. 7 is a cross sectional view of a photonic structure in an intermediary stage of fabrication after being subject to planarization and surface smoothing.

Further referring to FIG. 6, there can be formed waveguiding layer 310 over layer 120. Waveguiding layer 310 can be a nitride waveguiding layer for use in patterning waveguides. Referring to FIG. 7, FIG. 7 illustrates the photonic structure 10 of FIG. 6 after planarization of waveguiding layer 310. Waveguiding layer 310 can be utilized in the fabrication of a nitride waveguide, e.g., formed of silicon nitride (SiN).

In one embodiment, plasma enhanced chemical vapor deposition (PECVD) can be employed for deposition of silicon nitride forming layer 310. PECVD can be performed with use of reduced thermal budget, e.g., at a temperature in a temperature range of from about 300 degrees Celsius to about 500 degrees Celsius. It was observed that certain photonic device fabrication flows cannot sustain thermal treatments of that nature. Accordingly, PECVD silicon nitride can be advantageous.

Use of PECVD processing for deposition of waveguiding layer 310 formed of silicon nitride can be combined with additional processes for reducing the optical absorption of formed nitride. For example, layer 1202 which can provide a capping layer formed of oxide and waveguiding layer 310 which can be formed of nitride can be subject to controlled fabrication process, e.g., chemical-mechanical polishing processes to smooth the surfaces of the oxide and nitride layers. Furthermore, deposition conditions can be controlled to adjust properties of formed material. Exemplary deposition adjustments can include the alteration of substrate temperature, plasma power, forward bias, chamber pressure conditions, and precursor flow ratios. The indicated condition changes greatly depend on the chamber configuration and exact nature of precursors, and are therefore omitted from this disclosure. It is noted, however, that stoichiometric silicon nitride, i.e., nitride with a 3:4 silicon-to-nitride ratio, can be attained under a multitude of process conditions, and a great degree of freedom exists to tailor the optical properties to the desired values (refractive index≈2.0 and low propagation losses<0.5 db/cm). Further annealing processes can be performed on waveguiding layer 310 to remove contaminates and gaseous inclusions, thus further improving structural and optical properties.

In addition, formed nitride waveguides can be subject to line edge roughness treatment. A steam or high-pressure oxidation at moderate to high temperatures can convert the few outermost nanometers of the silicon nitride to silicon dioxide. After removal of said silicon dioxide in an aqueous hydrofluoric acid solution, the average surface roughness of the silicon nitride is improved.

It was observed that silicon nitride waveguides can have indices of refraction (near 2.0) close to indices of refraction of a surrounding dielectric material (1.45) and accordingly can co-transmit a relatively larger portion of the propagating light waves in a surrounding dielectric material. Defects (voids) and optical absorption in dielectric material surrounding formed waveguides can be particularly important in the case of nitride waveguides. Low overall levels of optical propagation loss can only be maintained with use of appropriate dielectric cladding material, e.g., gap-filling low-temperature oxide as set forth herein.

FIG. 7 depicts the photonic structure 10 after chemical-mechanical polish to smooth the top surface of waveguiding layer 310 formed of silicon nitride.

Figure 8:
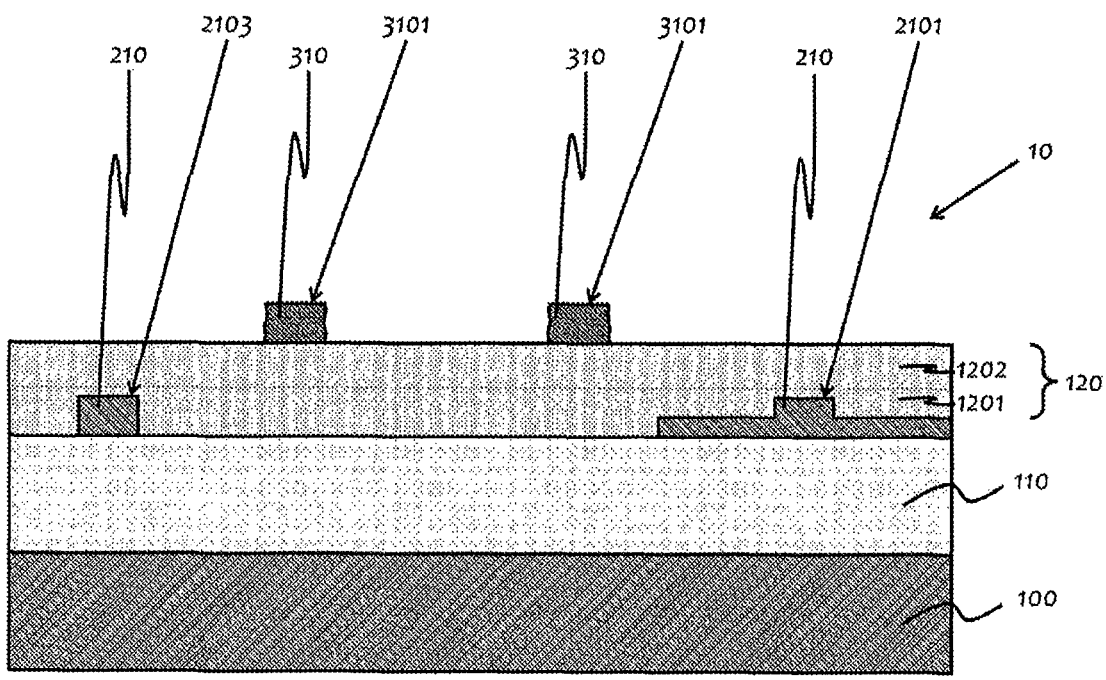
FIG. 8 is a cross sectional view of a photonic structure in an intermediary stage of fabrication after waveguide patterning and sidewall roughness treatment.

Referring to FIG. 8, the photonic structure 10 is shown after patterning of waveguiding layer 310 to form waveguides 3101 which can be followed by line-edge roughness mitigating treatment. The processing performed can be wet oxidation followed by a brief immersion in an HF-based solution to remove the resulting oxide on the surface of nitride waveguides 3101.

Figure 9:
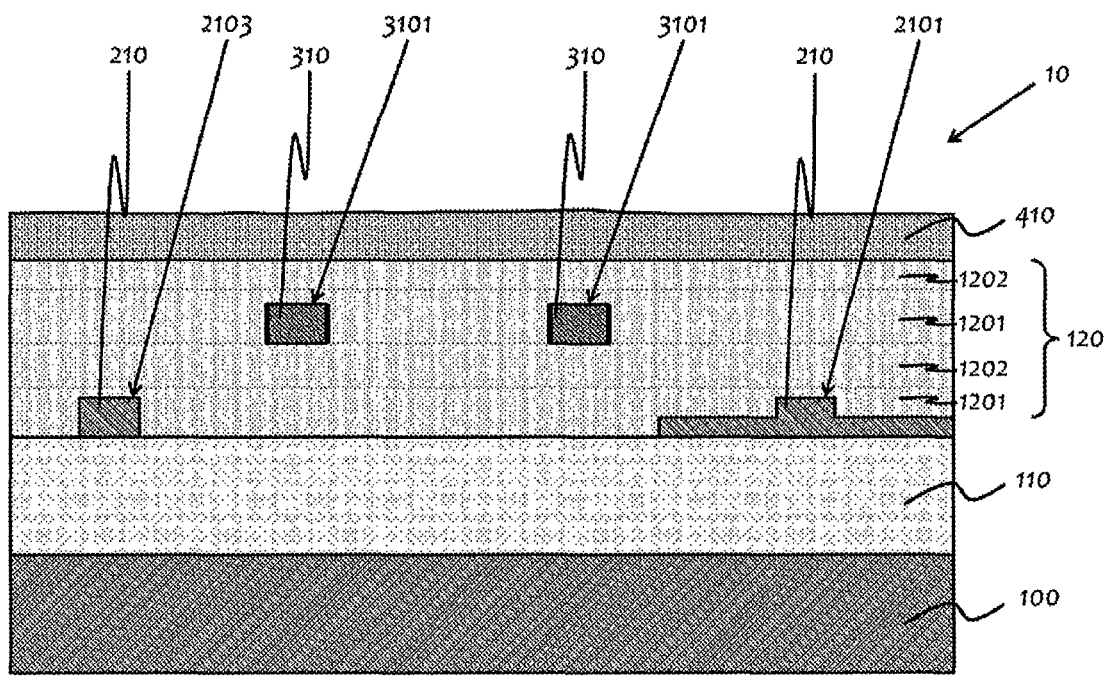
FIG. 9 is a cross sectional view of a photonic structure in an intermediary stage of fabrication after deposition of a third waveguide over a second waveguiding layer.

In a similar fashion, FIG. 9 illustrates the photonic structure 10 shown in FIG. 8 after forming of layer 120 over patterned sections of waveguiding layer 310. Layer 120 can include layer 1201 which can be a deposited cladding layer formed of oxide and layer 1202 which can be a deposited capping layer formed of oxide. Layer 1201 can extend to an elevation above a top elevation of waveguide 3101 and waveguide 3102. Further referring to FIG. 9 there can be formed on layer 120, waveguiding layer 410. Waveguiding layer 410 in one embodiment can be an amorphous or polycrystalline silicon layer for use in fabrication of one or more waveguide formed of amorphous silicon or polycrystalline silicon, subsequently subjected—but not shown—to a smoothing polish, patterning to define waveguide features, and line-edge roughness mitigation treatment.

Line edge roughness treatments for silicon waveguides e.g. waveguide 2101 or waveguide 2103 may also include techniques such as $H_2$ annealing using reduced pressure chemical vapor deposition (RPCVD) or rapid thermal chemical vapor deposition (RTCVD) processing or depositing epitaxial silicon on silicon waveguides. The $H_2$ annealing can be performed at a temperature of between about 700 degrees Celsius and about 950 degrees Celsius and at a pressure of from about 1 Torr to about 1 Atmosphere. In one example the annealing condition can include a temperature of about 900 degrees Celsius and a pressure of about 100 Torr.

Figure 10:
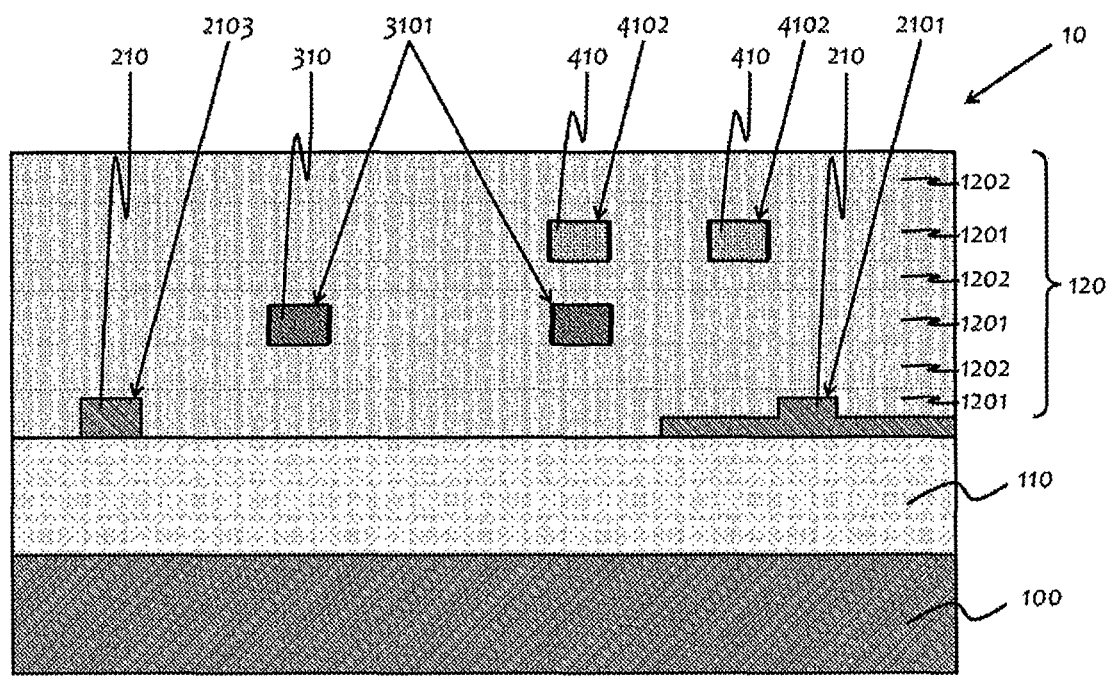
FIG. 10 is a cross sectional view of a photonic structure in an intermediary stage of fabrication after waveguiding layer planarization and smoothing, patterning of waveguides from a layer formed of a second waveguiding material, sidewall roughness treatment, and deposition, planarization, and encapsulation using low-temperature oxide.

Referring to FIG. 10, a photonic structure 10 is schematically depicted after patterning of waveguiding layer 410 to define waveguides 4102 and after formation of a section of layer 120 over waveguiding layer 410. As shown in FIG. 10, layer 120 can include layer 1201 which can be a cladding layer surrounding waveguides 4102 defined by waveguiding layer 410 and layer 1202 formed on layer 1201 surrounding waveguides 4102 defined by waveguiding layer 410. Layer 1201 and layer 1202 can be formed of dielectric material, e.g., oxide.

Figure 11:
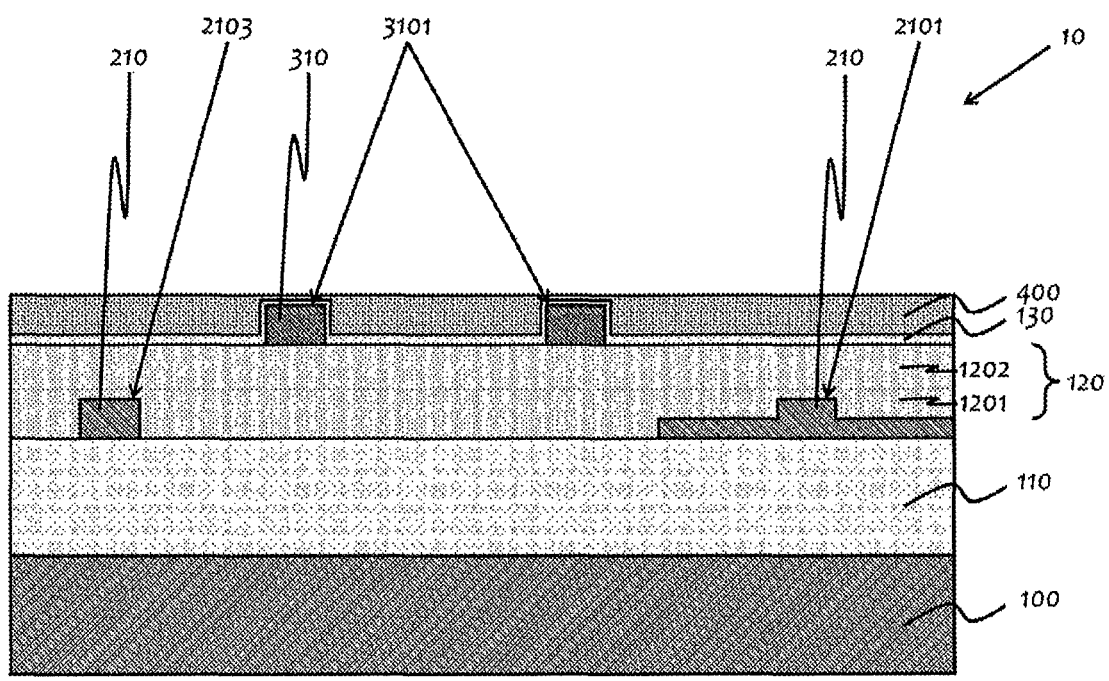
FIG. 11 is a cross sectional view of a photonic structure in an intermediary stage of fabrication after formation and planarization of a layer of waveguiding material (for example: amorphous or poly-crystalline silicon)
Figure 12:
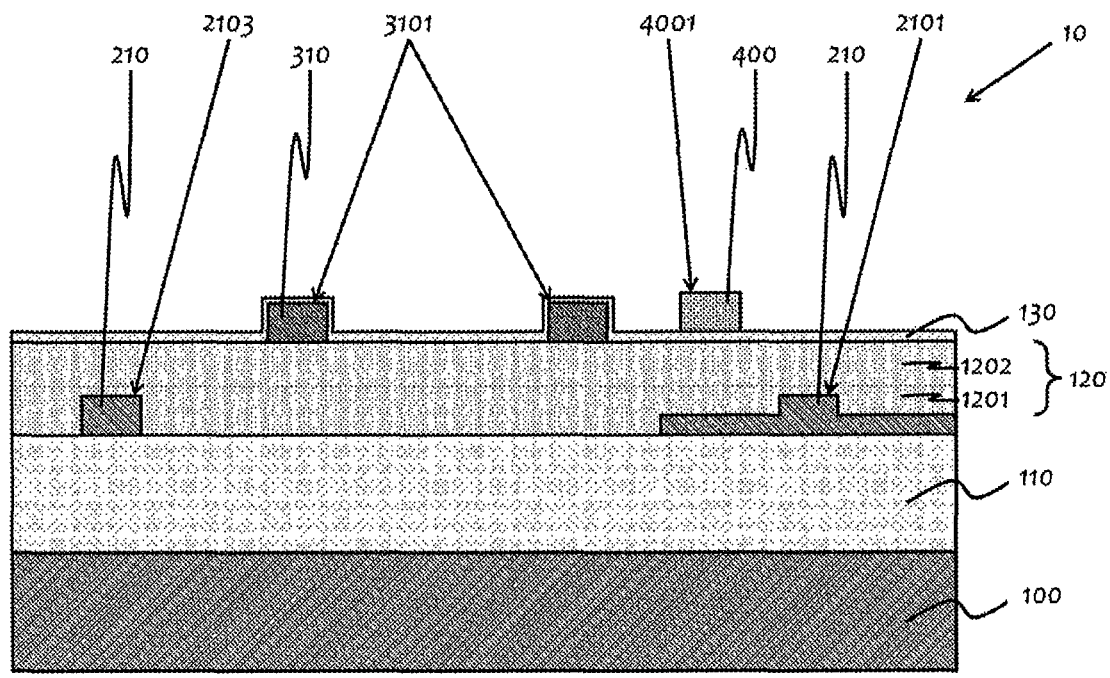
FIG. 12 is a cross sectional view of a photonic structure in an intermediary stage of fabrication after patterning and sidewall roughness treatment of a layer formed of waveguiding material.

FIGS. 11 and 12 illustrate a method for fabricating exemplary implementation of photonic structure 10 as shown in FIG. 8 having waveguides of different materials (e.g. waveguides 3101 and 4001) formed at a common elevation.

Referring to FIG. 11, layer 130 which can be a thin dielectric material and layer 400 which can be formed of amorphous silicon or polycrystalline silicon can be deposited conformally over dielectric layer 120 and waveguides 3101 (not shown). Referring further to FIG. 11, the exemplary photonic structure 10 is depicted after a treatment of planarization that serves to correct the thickness of waveguiding layer 400, smooth the top surface of waveguiding layer 400, and remove almost completely excess material of waveguiding layer 400 over waveguides 3101 defined in waveguiding layer 310.

Referring to FIG. 12, the exemplary photonic structure 10 as illustrated in FIG. 11 is shown after patterning of waveguiding layer 400 to define waveguide 4001. Waveguiding layer 400 can be formed of amorphous silicon or polycrystalline silicon. Further referring to FIG. 12, waveguide 3101 and waveguide 4001 formed of different materials can be formed at a common elevation, disregarding the finite thickness of layer 130. Structures e.g. first and second waveguides can be regarded to have a common elevation herein if an imaginary horizontal plane extending parallel to substrate 100 can extend through the structures e.g. the first and second waveguide. In one embodiment, layer 130 can be omitted prior to formation of layer 400, resulting in the bottom of waveguide 3101 and a bottom of waveguide 4001 to be formed at a common elevation. Omission of layer 130 is challenging but possible owing to the material dissimilarities between layer 310 and layer 400.

Figure 13:
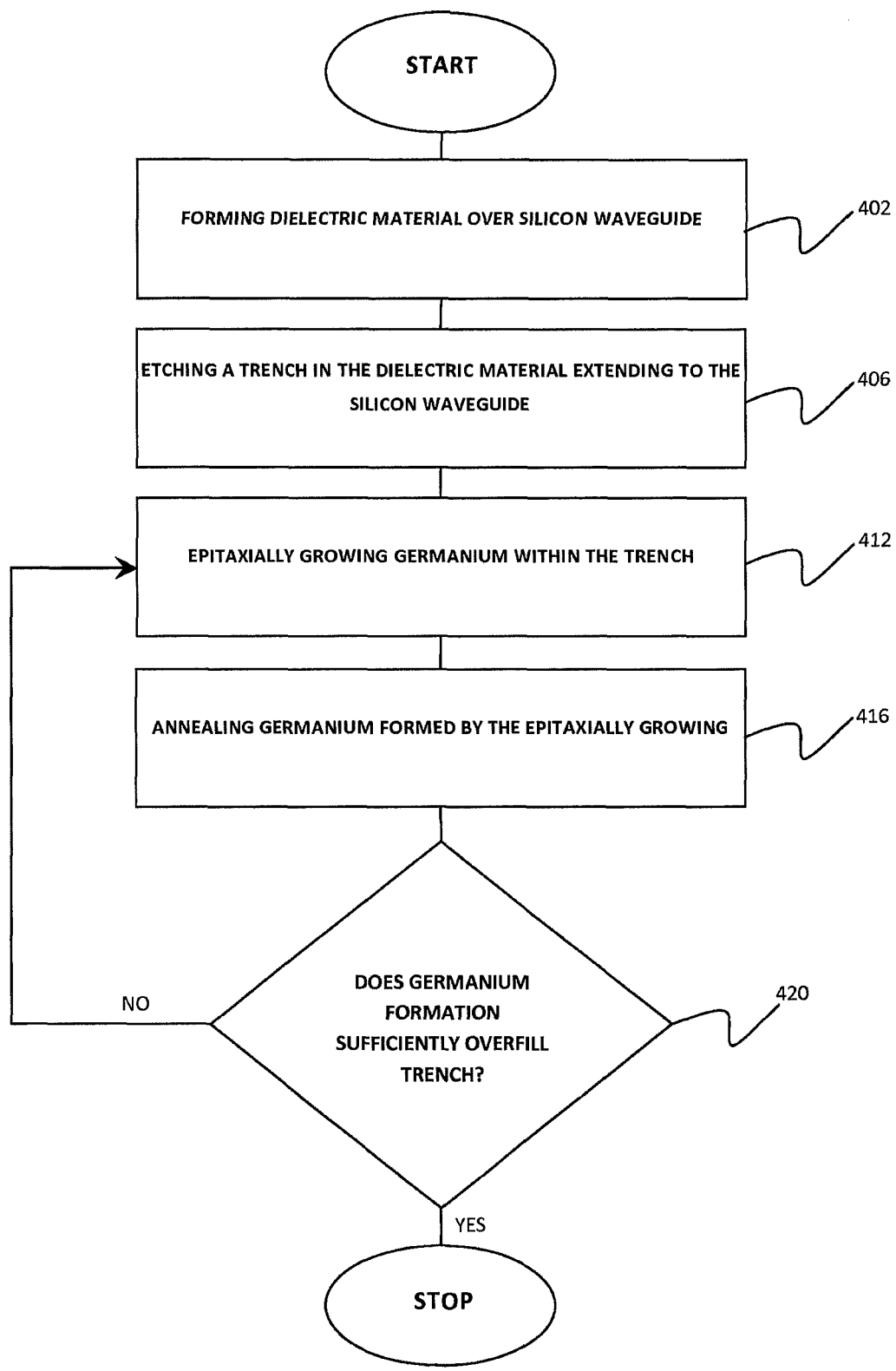
FIG. 13 is a flow diagram illustrating a method for fabrication of a photonic structure for use in photodetectors.

In one embodiment, photonic structure 10 can be adapted for detection of light in the communications wavelength range. A flow diagram illustrating a method for fabricating a photonic structure 10 having a photodetector is illustrated in FIG. 13. According to a method in one embodiment, there is performed at block 402 forming a layer of dielectric material over a silicon waveguide and at block 406 etching a trench in the layer extending to the silicon waveguide. There can be performed at block 412 epitaxially growing germanium within the trench and at block 416 annealing germanium formed by the epitaxial growing. There can be performed repeating of the epitaxial growing and annealing until the germanium overfills the trench sufficiently (block 420).

As a result of performance of the method of FIG. 13 there can be formed a germanium-based photodetector that can be absent of a low-temperature buffer layer connecting the germanium formation to the silicon surface. The resulting photonic structure 10 defining a photodetector provides for low leakage current and increased signal to noise ratio.

Further aspects of the method of FIG. 13 are described with reference to FIGS. 14-17 showing a photonic structure in various intermediary stages of fabrication. There is set forth herein a silicon photonic structure and process wherein vertical photodetector integrated on a silicon-on-insulator (SOI) wafer 102. In one embodiment, a vertical photodetector can be integrated on a SOI top silicon waveguiding level by patterning trenches within a layer of dielectric material, e.g., oxide, filling with crystalline germanium, planarizing the overfill of the germanium, and forming top and bottom contacts.

Figure 14:
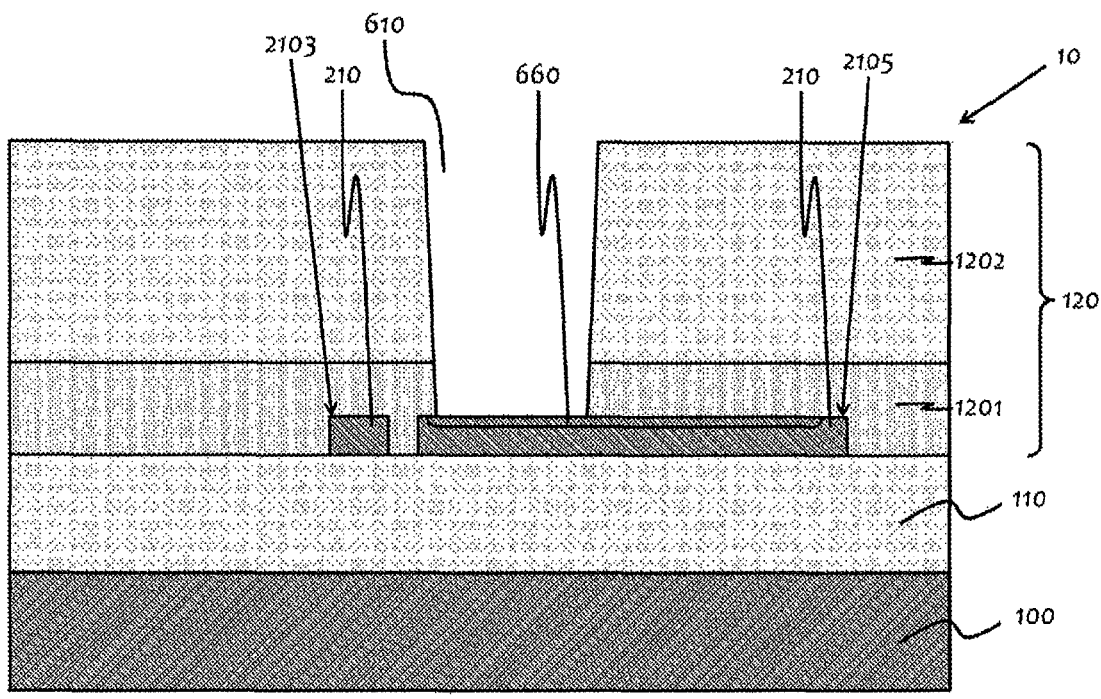
FIG. 14 is a photonic structure in an intermediary stage of fabrication after formation of a detector trench in planarized oxide over waveguiding features in crystalline silicon.

FIG. 14 depicts photonic structure 10 in an intermediary stage of fabrication that illustrates performance of block 402 (forming dielectric material over a silicon waveguide) and block 406 (patterning a trench). Photonic structure 10 can include a substrate 100 formed of silicon, a layer 110 formed of buried oxide, a waveguide 2105 of which a detector plateau section is shown in FIG. 14, a waveguide 2103, and a layer 1201 which can be a cladding layer formed of dielectric material e.g. oxide formed over waveguide 2105 and waveguide 2103, which waveguides can be patterned in and defined by waveguiding layer 210 which can be formed of silicon. Layer 120 formed over waveguide 2105 and waveguide 2103 can include layer 1201 which can be a cladding layer and layer 1202 which can be a capping layer. Layer 1201 and layer 1202 can have a combined thickness of greater than about 500 nm, and in one embodiment between about 500 nm and about 1500 nm. In one embodiment, cladding layer 1201 in combination with a capping layer 1202 has a combined thickness of about 1000 nm so that a height of a formed photodetector structure has a height of about 800 nm to about 1000 nm.

Further details of block 406 (formation of trench) are set forth with reference to FIG. 14. Photonic structure 10 as shown in FIG. 14 is illustrated after formation of a detector trench 610 which can be patterned to extend to an underlying silicon waveguide 2105. Patterning may be performed using e.g. one or more of lithography, dry etching, or wet chemical processing. In one embodiment, a formed trench 610 can have a depth of greater than about 500 nm, and in one embodiment in the range of from about 500 nm and about 1500 nm. In one embodiment, trench 610 can have a depth of about 800 nm to about 1000 nm.

Figure 15:
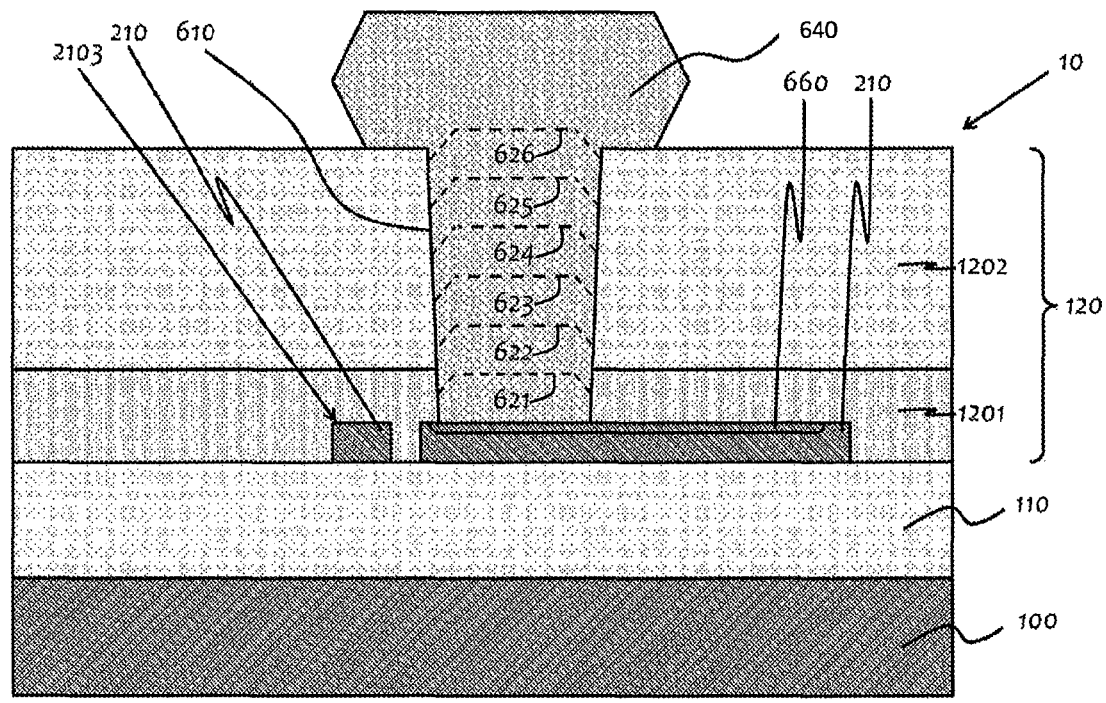
FIG. 15 is a photonic structure in an intermediary stage of fabrication after cycles of selective epitaxial growth and in-situ annealing to form a low defect-count single-crystalline germanium formation that overfills a trench.

Further details of block 412 (epitaxially growing), block 416 (annealing), and loop 420 (repeating of epitaxial growing an annealing) are set forth with reference to FIG. 15 illustrating a photonic structure 10 in an intermediary stage of fabrication wherein a germanium formation 640 overfills trench 610.

Prior to performance of block 412 (epitaxially growing of germanium) the photonic structure 10 as shown in FIG. 14 can be subject to an ex-situ and/or in-situ surface cleaning process consisting of a wet chemical or dry native oxide removal followed by a short in-situ high-temperature bake in a reducing hydrogen atmosphere. The latter can be responsible for removing sub-stoichiometric surface oxide reformed by exposure to air between the cleaning tools and epitaxial reactor.

FIG. 15 illustrates the photonic structure of FIG. 14 after formation of germanium within a trench 610. By epitaxial growing and annealing of germanium, trench 610 patterned in layer 120 can be filled with doped or intrinsic crystalline germanium.

Referring to block 412 (epitaxially growing) and block 416 (annealing) sections of germanium can be selectively grown and annealed within trench 610. In one embodiment, germanium can be selectively grown at block 412 using reduced pressure chemical vapor deposition (RPCVD). Referring to block 412 (epitaxially growing of germanium) a multi-step high-rate deposition process can be performed at a temperature of between about 550 to about 850 degrees Celsius and at a pressure of between about 10 Torr and about 300 Torr using germane and $H_2$ as the precursor and carrier gas, respectively. The temperature can be a stable temperature or a variable temperature. The pressure can be a stable pressure or a variable pressure. Epitaxially growing at block 412 can be performed without use of a doping gas (e.g. diborane for p-type, arsine or phosphine for n-type). At block 412 in one particular embodiment, about 200 nm of intrinsic (or doped) Ge can be grown selectively (to elevation 621) using germane and hydrogen at a temperature in the temperature range of between about 550 degrees Celsius to about 700 degrees Celsius and at a pressure in the temperature range of between about 10 Torr to about 25 Torr.

Referring to block 416 (annealing) in one embodiment a deposition chamber can be purged and the germanium deposited by epitaxially growing at block 412 can be annealed at a temperature of between about 650 degrees Celsius to about 850 degrees Celsius and at a pressure of between about 100 Torr and about 600 Torr (300 Torr in one embodiment). The temperature can be a stable temperature or a variable temperature. The pressure can be a stable pressure or a variable pressure.

A germanium film formed by epitaxially growing and annealing can include intrinsic germanium or doped germanium. For doping of formed germanium, dopant gases (such as diborane, phosphine, arsine) can be added to the source gas, e.g., $H_2$, used during RPCVD epitaxial growing.

Referring to FIG. 13, block 410 and block 416 (epitaxially growing and annealing) can be repeated until (block 420) deposited germanium sufficiently overfills trench 610. In one embodiment, an overfill can be regarded to be sufficient when an overfill allows appropriate corner coverage. In one embodiment, six epitaxially growing and annealing cycles (about 200 nm each) can be used to overfill trench 610. For example, after a first (initial) expitaxially growing and annealing cycle, deposited germanium can extend to elevation 621 as shown in FIG. 15. After a second epitaxially growing and annealing cycle, deposited germanium can extend to elevation 622. After a third epitaxially growing and annealing cycle, deposited germanium can extend to elevation 623. After a fourth epitaxially growing and annealing cycle, deposited germanium can extend to elevation 624. After a fifth epitaxially growing and annealing cycle, deposited germanium can extend to elevation 625. After a sixth epitaxially growing and annealing cycle, deposited germanium can extend to elevation 626 and can overfill trench 610 as is depicted in FIG. 15. The misfit of the Ge to the Si lattice due to atomic size results in a vast amount of strain-related crystal defects that can extend well past the initial growth interface. The annealing within each growing and annealing cycle can serve to annihilate dislocations and other extended defects inside formed germanium of germanium formation 640.

As noted epitaxially growing (block 412) and annealing (block 416) can be repeated in a cycle until the desired fill height is achieved which can occur e.g. when deposited germanium sufficiently overfills trench 610. It was observed that epitaxial germanium can grow at much reduced rates in the <110> and <111> crystal directions relative to the vertical <100> direction. This lag in epitaxial growth near the edges and corners of trench 610 can be overcome by overfilling trench 610. In one embodiment, an overfill of about 1.0 μm can be used to ensure high quality fill of trench edges and corner points. After six cycles in the embodiment depicted in FIG. 15, the top of the <100> Ge growth front has reached the top of trench 610. For final processing, a 0.5 μm overfill deposition/annealing cycle followed by a 0.5 μm final growth can be employed to finalize the Ge fill. Finalizing the growth/annealing sequence with growth rather than annealing can be advantageous due to observed redistribution of the Ge feature, especially near the corner points.

In an alternative method described with reference to the intermediary fabrication stage depicted in FIG. 15, a silicon germanium (SiGe) or Ge buffer layer can be formed on a top surface of silicon waveguide 2105 prior to formation of germanium (Ge). A SiGe or Ge buffer can be deposited using reduced pressure chemical vapor deposition (RPCVD) at temperatures in the range of from about 300 degrees Celsius to about 450 degrees Celsius. Such processing can be useful in various embodiments. In one embodiment, a formed SiGe or Ge buffer can be in-situ doped (n-type or p-type). For formation of a SiGe or Ge buffer, silane ($SiH_4$) can be used as Si source gas and germane ($GeH_4$) can be used as a Ge source gas. For formation of doped buffer layer, diborane ($B_2H_6$), phosphine ($PH_3$), or arsine ($AsH_3$) can be used as doping gases. However, it was observed that the aforementioned low temperature range can furnish excessively low growth rates and can necessitate disproportionately long process durations. In addition, reactor and gas purity requirements can become increasingly stringent as temperature is lowered.

With the method set forth in reference to FIG. 13 a resulting photonic structure 10 can be absent of a challenging low-temperature SiGe or Ge buffer and can rather include germanium formed adjacent to and directly on a waveguide e.g. waveguide 2105 which can be formed of silicon. According to the method provided in FIG. 13, the formed photonic structure 10 for use in a photodetector structure that is absent a low-temperature SiGe or Ge buffer can feature a reduced amount of extended defects and therefore reduced reverse leakage current—important for efficiency and speed of detection of light.

The method of FIG. 13 is particularly adapted for use in creating germanium formations in trenches having widths of less than about 150 μm. Trenches having widths of greater than about 150 μm can exhibit a reduced fill height as well as severe surface roughening. Because common optical device trench widths in photonic devices are less than about 10 μm, the method is well suitable for use with a wide range of photonic devices. It was observed that restricting an area for growth of germanium e.g. to an area defined by a width of trench 610 can reduce formation of anomalous features and can facilitate growth of germanium on a layer of silicon without a low-temperature SiGe or Ge buffer between a germanium formation and a silicon layer. Trench 610 can have a width of less than about 10 μm and in one embodiment can feature excellent fill character to widths as small as 200 nm or smaller.

Figure 16:
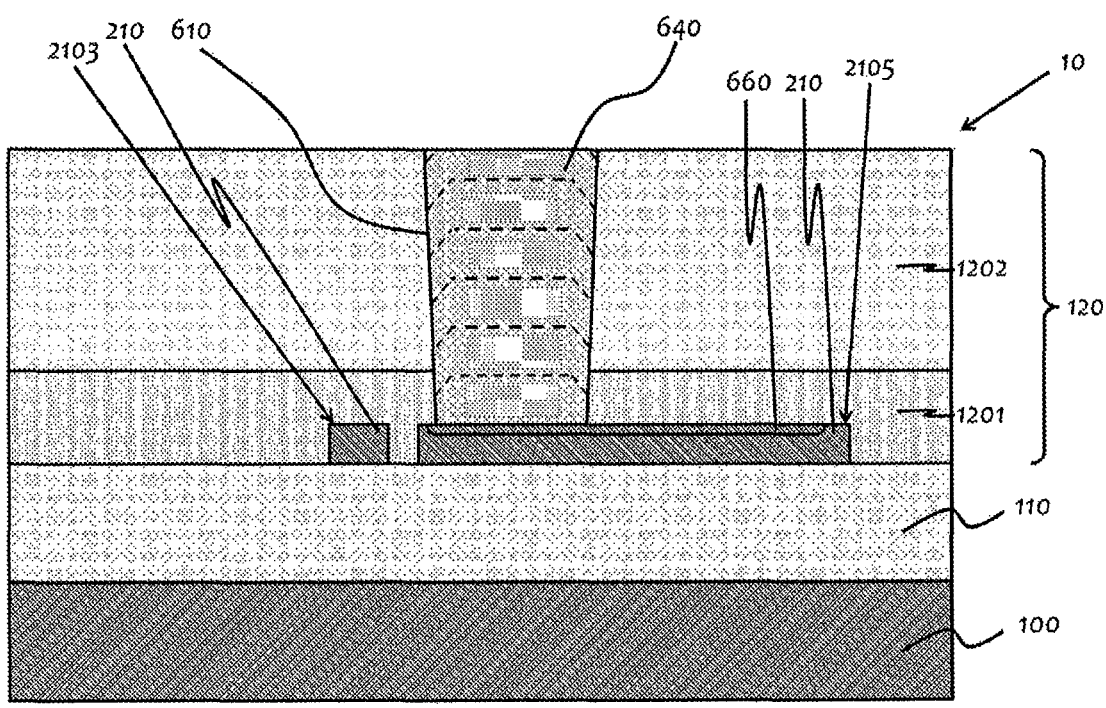
FIG. 16 is a photonic structure in an intermediary stage of fabrication after planarizing the overgrown portion of the germanium formation.

Referring again to the flow diagram of FIG. 13 planarization processing can be performed subsequent to block 420. FIG. 16 illustrates the photonic structure of FIG. 15 after planarizing of germanium. An overfill portion of germanium can be removed and planarized so that a top elevation of a germanium formation 640 can be in common with a top elevation of layer 1202 which can be a capping layer. A chemical mechanical planarization (CMP) process can be used for performance of planarization. A CMP process can be used that selectively removes Ge with insignificant erosion of layer 1202 which can be formed of oxide. An overgrown germanium formation 640 can exhibit a mushroom like structure as shown in FIG. 15 with well-defined facets and sharp corners and crests. For removal of such features, a CMP process can include using a modified slurry (hydroxide based) and a first soft pad followed by the use of second hard (or standard) pad.

Figure 17:
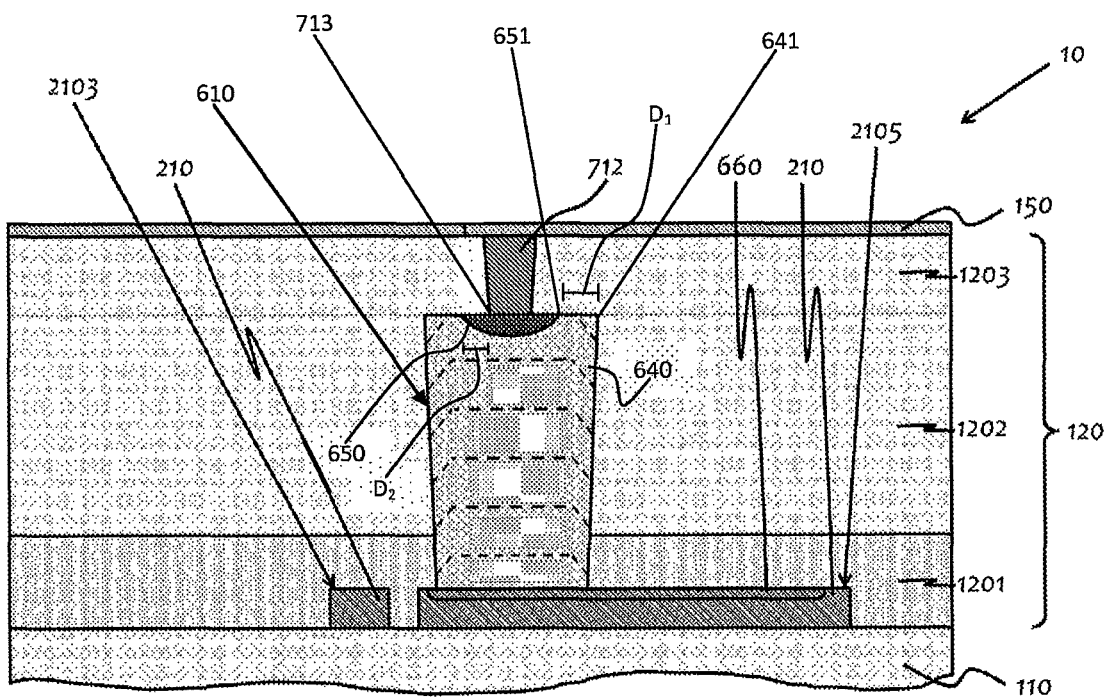
FIG. 17 is a photonic structure in an intermediary stage of fabrication after formation of conductive top contact and capping with a layer formed of a first hardmask material.

Subsequent to planarizing, the photonic structure 10 as depicted in FIG. 16 can be subject to further processing to complete fabrication of a photodetector structure. FIG. 17 illustrates the photonic structure of FIG. 16 after formation of top contact ion implantation region 650, depositing of a layer 1203 formed of dielectric material e.g. oxide over layer 1202, and patterning and filling of a trench shown occupied by conductive material formation 712 with a conductive material formation 712. Layer 120 formed of dielectric material can include layer 1201 which can be a cladding layer, layer 1202 which can be a capping layer, and layer 1203 which can be a contact spacer layer. Further in reference to FIG. 17 a bottom contact ion implantation region 660 can be formed in waveguide 2105 of layer 210 prior to the construction of dielectric layer 120 and trench 610 defined in layer 120. In an alternative embodiment, a bottom contact ion implantation region 660 can alternatively be formed in germanium formation 640. In an alternative embodiment, a bottom contact ion implantation region 660 can alternatively be formed partially in waveguide 2105 and partially in germanium formation 640. Formation of ion implantation region 650 and ion implantation region 660 in germanium formation 640 or in a structure adjacent to germanium formation 640 as set forth herein defines a p-i-n photodetector structure (p region at bottom) or n-i-p photodetector structure (n region at bottom).

In one aspect, a location of ion implantation region 650 can be restricted to a reduced area of germanium formation 640. Ion implantation region 650 in one embodiment can be defined within a perimeter 651. In one aspect, ion implantation region 650 can be formed to have a trench to ion implantation region spacing distance $D_1$ equal to or greater than a threshold distance, $L_1$. Spacing distance $D_1$ can be the distance between perimeter 651 of ion implantation region 650 and the perimeter 641 of germanium formation 640 (in contact with layer 120 which can be formed of oxide). Because perimeter 641 of germanium formation 640 can be in contact with layer 120 that can define trench 610, the spacing distance $D_1$ can also be the distance between perimeter 651 of ion implantation region 650 and trench 610. In one embodiment, spacing distance $D_1$ can be substantially uniform throughout a top area of germanium formation 640 and can be in a direction extending normally to perimeter 651 of ion implantation region 650 and perimeter 641 of germanium formation 640. In such embodiment, the spacing distance $D_1$ can be equal to or greater than the noted threshold distance throughout an entirety of perimeter 651 of ion implantation region 650 and the entirety of perimeter 641 of germanium formation 640. In one embodiment $L_1$ is 100 nm; in another embodiment 200 nm; in another embodiment 300 nm; in another embodiment 400 nm, in another embodiment 500 nm; in another embodiment 600 nm; in another embodiment 700 nm; in another embodiment 800 nm; in another embodiment 900 nm; in another embodiment 1.0 µm. A spacing distance $D_1$ can be designed based on, e.g., dimensional widening of features during processing, minimum printable feature dimensions, and reliable maximum feature printing misalignment.

A silicon photonic structure and process is set forth herein where the germanium photodetector structure may contain a reduced area top ion implantation region 650 of the opposite polarity compared to the bottom ion implantation region 660. By forming ion implantation region 650 to have a trench to implantation spacing distance of $D_1$ an incidence of leakage current paths can be reduced. Reverse leakage current densities of less than about 1 nanoamperes per square micrometer can be achieved in one embodiment using top ion implantation region 650 spaced to a trench to implantation region spacing distance $D_1$ of equal to or greater than a threshold distance $L_1$ of 0.75 µm from the oxide trench (at perimeter 651) on each edge. Doses and energies can be tailored for producing a shallow ohmic contact to the conductor contact provided by conductive material formation 712, and a thin implant screening oxide can be employed to avoid Ge sputter removal. In one embodiment, ion implantation region 650 can be formed to define a shallow top ion implantation.

Further referring to FIG. 17, a trench shown occupied by conductive material formation 712 can be formed in layer 1203. Subsequently to formation of such trench, a conductive material formation 712 can be formed in the trench shown occupied by conductive material formation 712. For patterning of the trench shown occupied by conductive material formation 712, layer 150 formed of hardmask material can be formed over layer 1203. Layer 150 in one embodiment can have a thickness of from about 5 nm to about 150 nm and can be formed of dielectric hardmask material (e.g. silicon dioxide) and can serve to enhance dry etching performance and furnish a stopping layer in a subsequent conductor polishing process. Conductive material formation 712 can be formed of semiconductor-compatible metallization material that is reflective to wavelengths in the range of from about 900 nm to about 1600 nm. Conductive material formation 712 can be a germanide-free (refractory) conductive material formation. In one aspect, the trench shown occupied by conductive material formation 712 can be patterned so that conductive material formation 712 has a perimeter 713 that is spaced apart from a perimeter 651 of ion implantation region 650. Referring to FIG. 17, spacing distance $D_2$ can be the distance between perimeter 713 of contact formation 712 and perimeter 651 of ion implantation region 650. In one embodiment, the spacing distance $D_2$ can be equal to or greater than a threshold distance $L_2$. In one embodiment, spacing distance $D_2$ can be substantially uniform throughout an area of ion implantation region 650 and can be in a direction extending normally to perimeter 713 of contact formation 712 and perimeter 651 of ion implantation region 650. In such embodiment, the spacing distance $D_2$ can be equal to or greater than the noted threshold distance throughout an entirety of perimeter 713 of conductive material formation 712 and the entirety of perimeter 651 of ion implantation region 650. In one embodiment $L_2$ is 100 nm; in another embodiment 200 nm; in another embodiment 300 nm; in another embodiment 400 nm, in another embodiment 500 nm; in another embodiment 600 nm; in another embodiment 700 nm; in another embodiment 800 nm; in another embodiment 900 nm; in another embodiment 1.0 µm. Forming conductive material formation 712 to be spaced from a perimeter 651 of ion implantation region 650 assures that conductive material formation 712 can be fully contained within an area of ion implantation region 650. There is set forth herein a silicon photonic structure and process wherein a germanium photodetector structure may include a reduced area top metal conductive material formation 712 that is fully contained in an area of top ion implantation region 650. A spacing distance $D_2$ can be designed based on, e.g., dimensional widening of features during processing, minimum printable feature dimensions, and reliable maximum feature printing misalignment.

Prior to formation of conductive material formation 712, the trench shown occupied by conductive material formation 712 can be subject to various processes so that conductive material formation 712 can be substantially free of metal germanide phases (such as nickel germanide). Ion implantation region 650 allows for a reduced resistance connection to a germanide-free metal top contact formed of conductive material formation 712. In one embodiment, bottom ion implantation region 660 can be formed in waveguide 2105 defined by layer 210 formed of silicon.

Figure 18:
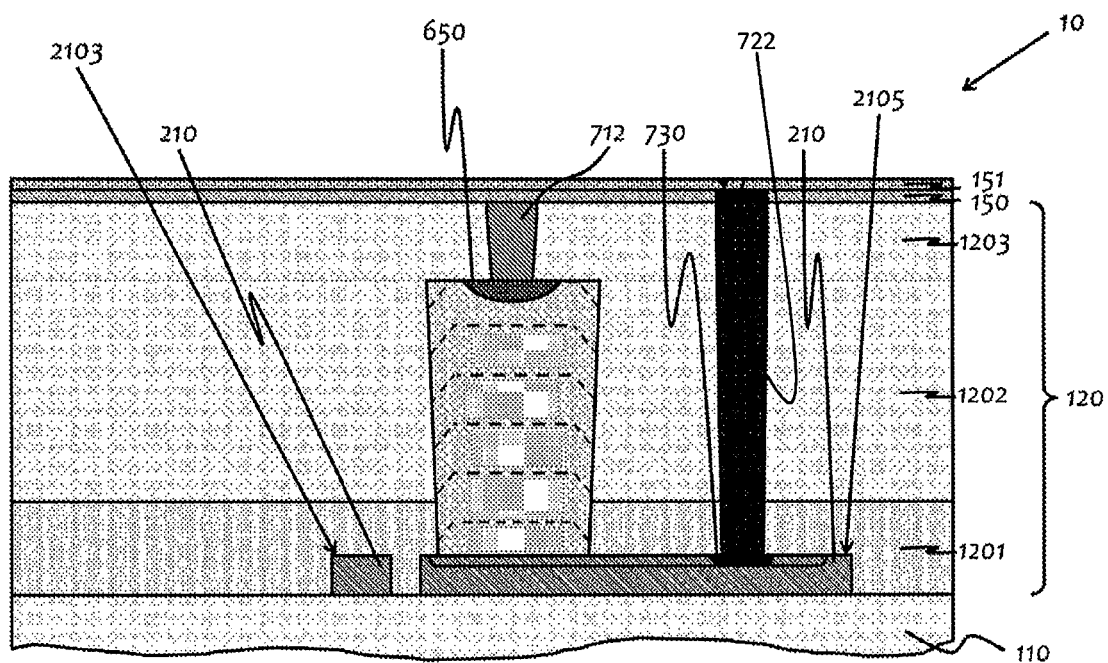
FIG. 18 is a photonic structure in an intermediary stage of fabrication after formation of a conductive bottom contact and capping with a layer formed of a second hardmask material.

Referring to FIG. 18, a method of fabrication of photonic structure 10 having a silicide contact interface is set forth herein. The photonic structure 10 pertains to an intermediate step of fabrication after formation of the trench shown occupied by conductive material formation 722. The trench shown occupied by conductive material formation 722 can be formed in layer 120 which can be formed of dielectric e.g. oxide material. After formation of the trench shown occupied by conductive material formation 722, a silicide formation 730 can be formed at a bottom of such trench, and then conductive material formation 722 can be formed in such trench.

In another aspect, photonic structure 10 can include a silicide formation 730. For formation of silicide formation 730, a metal, e.g., nickel (Ni) or nickel platinum (NiPt) layer can be sputtered into the trench shown as being occupied by conductive material formation 722 and subsequently annealed during a silicide formation stage so that the formed metal reacts with silicon of layer 210 to form silicide formation 730 which can define a silicide contact interface. Silicide formation 730 can be formed, e.g. of nickel silicide (NiSi) or nickel platinum silicide. In areas of photonic structure 10 other than at an interface to layer 210 formed of silicon, e.g., at sidewalls defining the trench shown as being occupied by conductive material formation 722 and at a top of layer 150, the deposited metal can remain unreacted. Prior to annealing in one embodiment, a thin capping layer (not shown, e.g., formed of titanium nitride (TiN)) can be formed over the formed nickel or nickel platinum. The thin capping layer can protect processing tools which might be negatively affected by metal evaporation. Unreacted metal (e.g., Ni, NiPt) and the thin capping layer can then be removed in an appropriate wet chemical solution. Photonic structure 10 can then be subject to further annealing in a transformation stage to transform silicide formation 730 into a low resistivity phase. The transformation stage annealing can be performed at a higher temperature than the silicide formation annealing. In one embodiment, transformation stage annealing can be performed at a temperature of between about 300 degrees Celsius and about 550 degrees Celsius. In one embodiment, the silicide formation stage annealing can be performed at a temperature of between about 350 degrees Celsius and about 500 degrees Celsius.

It was observed that challenges to the formation of silicide formation 730 as shown in FIG. 18 can be imposed by the configuration of the trench shown as being occupied by conductive material formation 722. In some embodiments wherein the trench shown as being occupied by conductive material formation 722 includes a narrow width, e.g. less than about 400 nm, it was observed that formed metal, e.g. Ni, NiPt may form preferentially on a top surface of photonic structure 10 (a top of layer 150) or sidewalls of the trench shown as being occupied by conductive material formation 722 relative to a bottom of trench at an interface to layer 210 which can be formed of silicon. In one embodiment, the trench shown as being occupied by conductive material formation 722 can include a depth of greater than about 1.3 µm and the width of greater than about 350 nm. To address such challenges, formed metal formed in the trench shown as being occupied by conductive material formation 722 for the formation of silicide can be overfilled within the trench shown as being occupied by conductive material formation 722 to assure that an appropriate volume of metal is formed at an interface to layer 210 which can be formed of silicon. In one embodiment, wherein the trench shown as being occupied by conductive material formation 722 includes depth of greater than about 1.3 µm and a width of greater than about 350 nm, of formed metal, e.g., Ni or NiPt can be deposited, e.g., via sputtering, to a depth of four times (4×) a desired depth at a bottom of the trench shown as being occupied by conductive material formation 722. In one embodiment, a formed metal can be deposited to a thickness of about 40 nm at a top of photonic structure 10 as shown in the intermediary fabrication stage of FIG. 18 to yield a thickness of about 10 nm at a bottom of the trench shown as being occupied by conductive material formation 722.

Further referring to FIG. 18, the photonic structure 10 is illustrated after formation of a conductive material formation 722 in the trench shown occupied by conductive material formation 722. Conductive material formation 722 can be formed of copper (Cu) in one embodiment by performing sputtering, plating, and a planarizing polish. Further referring to FIG. 18, layer 151 can be deposited on layer 150 prior to formation of a contact within the trench shown as being occupied by conductive material formation 722. Layer 151 can be formed of a dielectric hardmask material (e.g., silicon nitride) to a thickness of from about 5 nm to about 150 nm and serves to enhance dry etching performance and furnish a stopping layer for a polishing process in which conductive material formation 722 can be polished.

Aspects of top metal wire layers of photonic structure 10 are described with reference to FIGS. 19 and 20.

Figure 19:
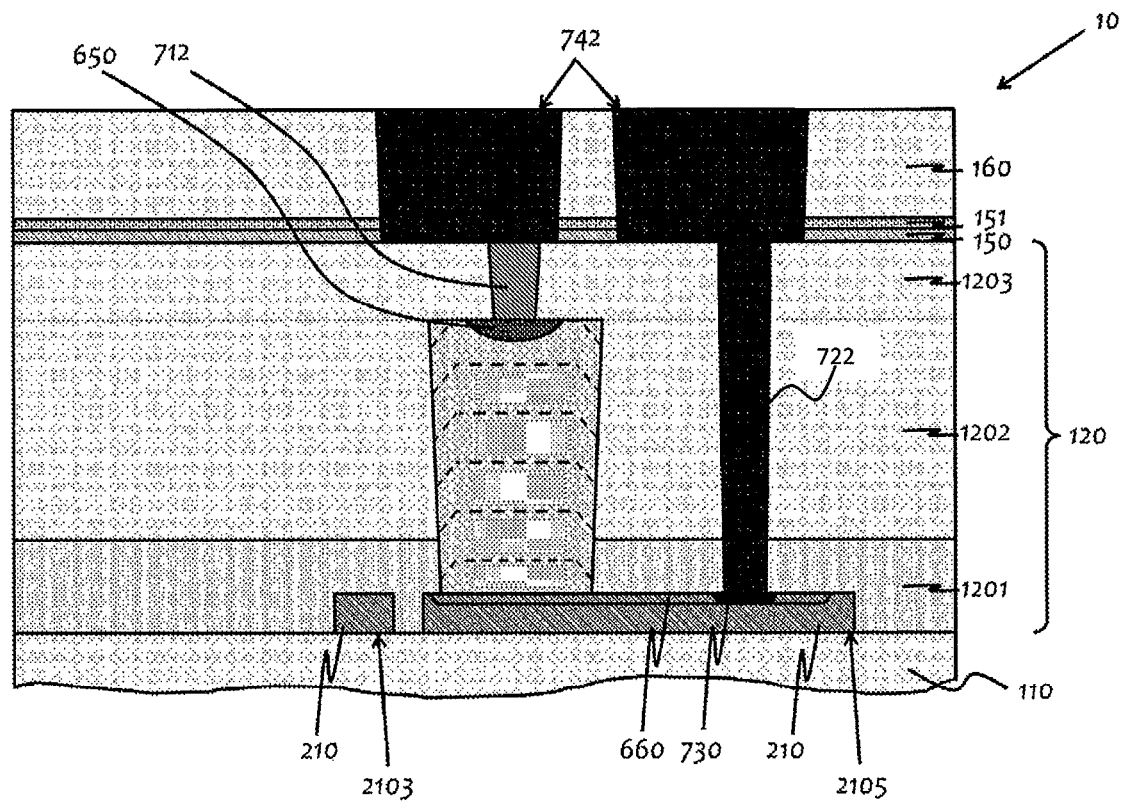
FIG. 19 is a photonic structure in an intermediary stage of fabrication after formation of a patterned conductive first wiring level.

Referring to FIG. 19, the photonic structure 10 is illustrated after formation of layer 160, patterning to form trenches shown occupied by conductive material formations 742, and filling such trenches with conductive material formations 742. Layer 160 can formed of a dielectric material e.g. oxide and can be formed over layer 151. Trenches shown occupied by conductive material formations 742 can be formed to extend through layer 160, layer 151 and layer 150 to expose conductive material formations 712 and conductive material formations 722. Conductive material formations 722 can include, e.g., copper, densified in a low-temperature anneal, and finally planarized so that conductive material formations 742 define flat wiring assemblies 742 as are depicted in FIG. 19.

Figure 20:
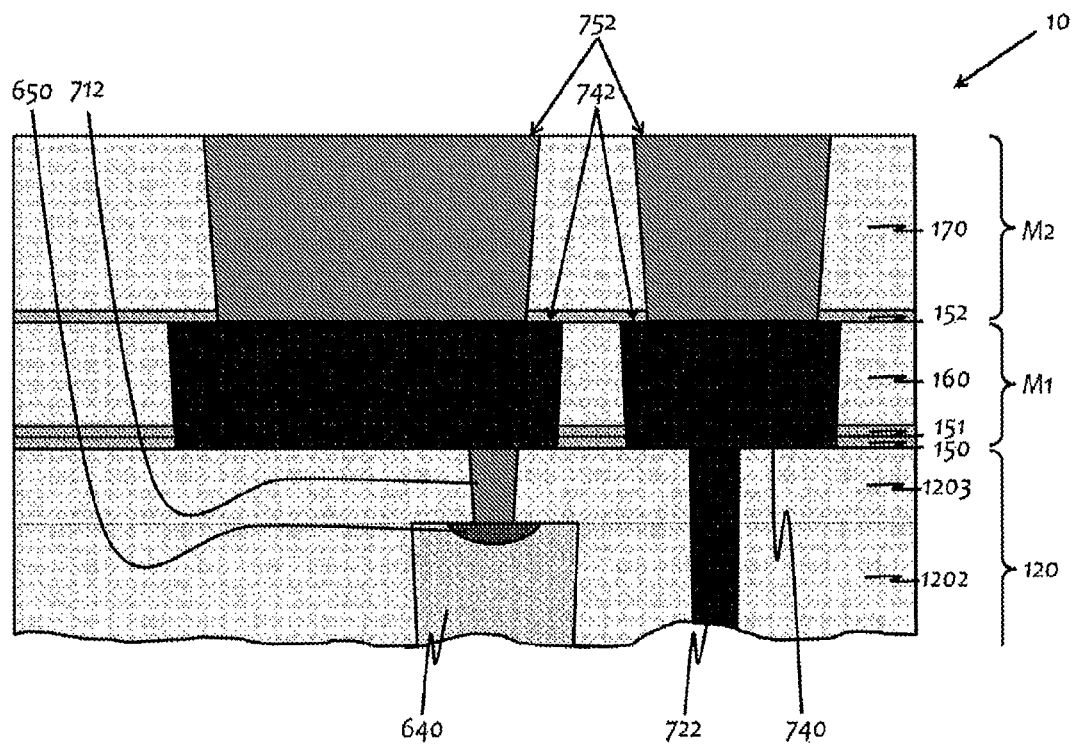
FIG. 20 is a photonic structure in an intermediary stage of fabrication after formation of a patterned conductive second wiring level.

Referring to FIG. 20, the photonic structure 10 shown in FIG. 19 is depicted after formation of layer 152 on layer 160 and formations 742 and after formation of layer 170 on layer 152, followed by patterning to form trenches shown occupied by conductive material formation 752, and filling such trenches with conductive material formations 752. Layer 170 can be a dielectric material e.g. oxide and formed over layer 152 and conductive material formations 742 that define wires. Trenches shown occupied by conductive material formations 752 can extend through layer 170 and layer 152 to expose conductive material formations 742.

Conductive material formations 752 can be formed of e.g. copper, tungsten, or aluminum, densified in a low-temperature anneal, and finally planarized so that conductive material formations 752 that define wires define flat wiring assemblies. Conductive material formations 752 as set forth in FIG. 20 can be formed of aluminum (Al) in one embodiment.

Photonic structure 10 set forth in reference to FIG. 20 can include a first metallization level M1 having first conductive material formations 742 in contact with conductive material formations 712 and 722 respectively, and a second metallization level M2 having second conductive material formations 752 in contact with conductive material formations 742 respectively. In the embodiment of FIG. 20, metallization layer M1 can include a conductive material formed of copper (Cu) and metallization level M2 can include a metal formation formed of aluminum (Al). Metallization level M2 including aluminum conductive metal can define a contact pad for accommodation of bonded wires or low temperature and high temperature device measurements.

Metallization level M2 as shown in FIG. 20 like metallization level M1 can be formed by a single layer damascene process wherein there is provided single-level patterning, filling, and planarization of conductive metallization material.

An alternative metallization damascene process is set forth in reference to FIG. 20, although not shown. If intermediate via connections are required between metallization level M1 and metallization level M2 as a consequence of circuit design, a dual damascene metallization process may be employed where the vias and metal wire trenches for accommodating conductive material formations 742 and conductive material formations 752 are formed first through sequential patterning and etching, and then filled and planarized in a common deposition (e.g., sputter), plating, and polishing process. Via connections may be required if for example metallization level M2 wire levels need to cross metallization level M1 wire levels without electrical contact. Dual damascene processes shorten the process flow and reduce complexity compared to two separate single damascene applications.

It was observed that commercially available deposition conditions that form waveguiding core materials (e.g., silicon or silicon nitride) require processing temperatures of greater than about 500 degrees Celsius. As an example, disilane is commonly used to deposit amorphous silicon at 550 degrees Celsius, and LPCVD silicon nitride is grown using substrate temperatures of greater than about 750 degrees Celsius. As the temperature of commercially available processing steps to complete the metal wiring formations on wafers can be limited to 400 degrees Celsius for the case of copper, traditional waveguiding core materials are not capable of integration into the wiring level modules. However, methods as set forth herein allow for significantly reduced substrate temperatures, thus enabling the integration of photonic elements in the back-end modules. For example, plasma enhancement during nitride CVD can reduce the processing temperature to a temperature in the range of 400 degrees Celsius. Similar temperatures can also be obtained using new long-chain precursors (such as pentasilane) during amorphous silicon CVD.

Figure 21:
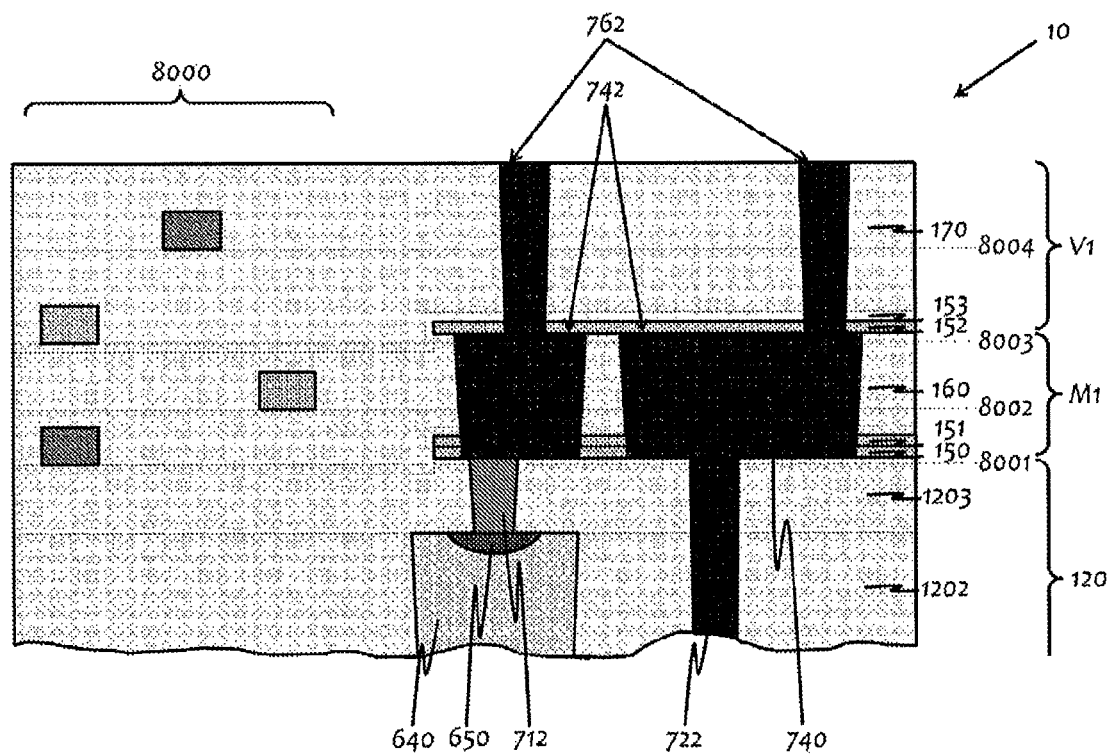
FIG. 21 is a photonic structure in an intermediate stage of fabrication having a waveguiding layer at a common elevation with a wiring level.

In one embodiment, with use of fabrication methods as are set forth herein the structure 10 can include photonic elements embedded in the back-end-of-the-line (BEOL) stack, after metallization is present on the wafer. Referring to FIG. 21, each via or wire metallization level such as the shown M1 and V1, can include waveguiding features 8000 (e.g., waveguides at an elevation in common with a bottom elevation of a wiring level, e.g., elevation 8001 or elevation 8003) or embedded within the bulk of a wiring level (e.g., at elevation 8002 or elevation 8004). Materials for waveguiding features embedded in BEOL assemblies can be formed, e.g., of silicon nitride or silicon. Regarding metallization layer V1, metallization layer V1 can be a vias metallization layer and can include conductive material formations 762 extending through layer 170, layer 153, and layer 152. Conductive material formations 762 can be in contact with conductive material formations 742. Regarding conductive material formations herein, e.g., formations 712, 722, 742, 752, 762, conductive material formations 712, 722, 742, 752, 762 herein can be formed, e.g., of semiconductor-compatible metallization materials. In one embodiment, conductive material formations 712, 722, 742, 752, 762 herein each can be formed of a metallization material that is adapted to reflect light at wavelengths within a communication band of wavelengths of from about 1.3 µm to about 1.55 µm. In one embodiment, conductive material formations 712, 722, 742, 752, 762 herein each can be formed of a metallization material that is adapted to reflect light at wavelengths within a band of wavelengths of from about 900 nm to about 1600 nm.

In one embodiment, fabrication of a photonic structure 10 as set forth in FIG. 21 having photonic elements embedded in BEOL assembly can include the removal of films of high refractive index (e.g., silicon nitride or nitrogen-rich SiC) from areas 8000 in the optical vicinity (typically from about 1 µm to about 10 µm) surrounding said embedded photonics elements. Furthermore, by way of altering the lithography mask design, fill and other shapes of the respective wiring levels can be eliminated from areas 8000 in the optical vicinity (typically from about 1 µm to about 10 µm) surrounding said embedded photonics elements.

In one embodiment, photonic structure 10 that includes photonic elements embedded in BEOL assembly can be subjected during the fabrication process to low-temperature line-edge roughness mitigation treatments, such as high-pressure oxidation followed by wet chemical oxide etching.

Figure 22:
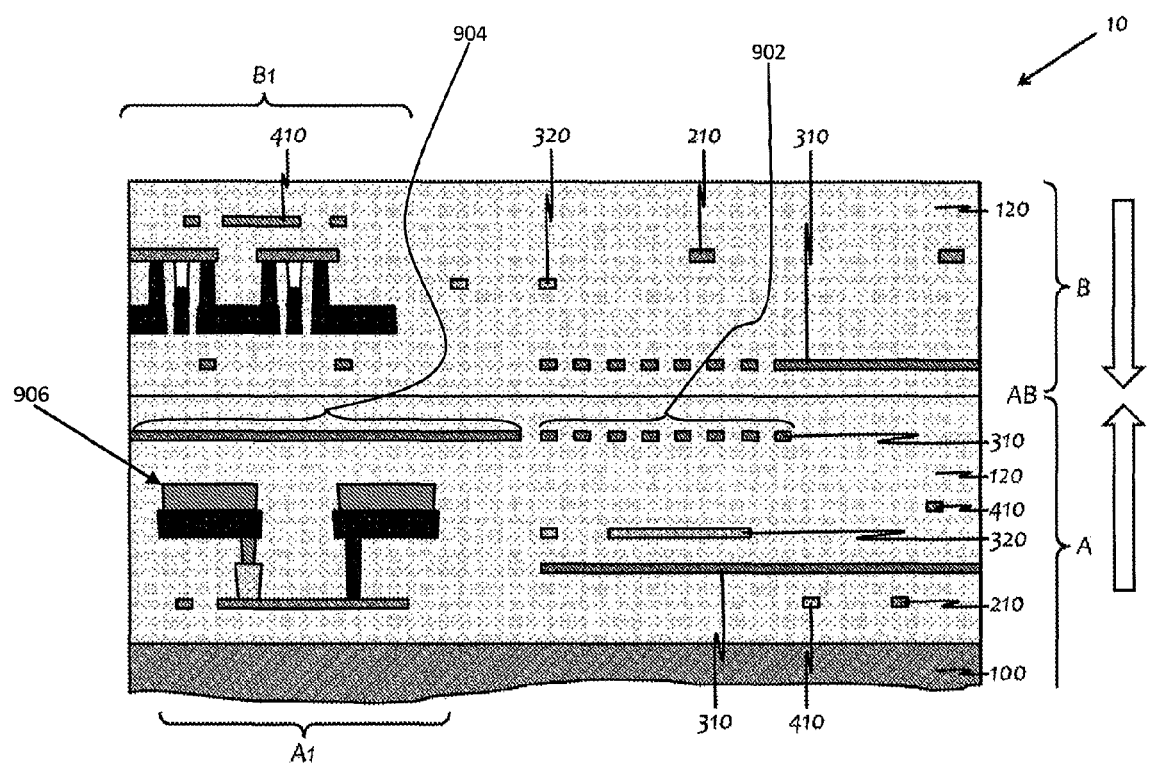
FIG. 22 is a photonic structure in an intermediate stage of fabrication having a photonic component embedded in an assembly created by bonding.

In one embodiment as depicted schematically in FIG. 22, photonic structure 10 can include photonic elements embedded in assemblies created by wafer-level or chip-level bonding, where full wafers or individual chips can be aligned and bonded to handle wafers. Handle wafer A and bonding wafer B can each include one or more photonic layers (e.g., waveguiding layer 210 waveguiding layer 310 waveguiding layer 320 and waveguiding layer 410 as shown in FIG. 22) distributed over FEOL and BEOL modules, and may be of common or dissimilar functionality. Regarding waveguiding layer 310 waveguiding layer 310 can be a silicon nitride waveguiding layer. At area 902 waveguiding layer 310 can be patterned into a plurality of waveguides. At area 904 waveguiding layer 310 can remain unpatterned. At area 904 common waveguiding layer 310 formed at an elevation higher than wiring assembly 906 can be aligned to the one or more conductive material formation defining wiring assembly 906 and function as a protect layer for protecting wiring assembly 906 which can include one or more copper conductive material formation. Waveguiding layer 310 at area 904 can inhibit diffusion of wiring assembly 906. Waveguiding layer 310 at area 904 can function as an etch stop layer for protection of one or more conductive material formation of wiring assembly 906. Wiring assembly 906 can configured in accordance with any of the wiring assemblies set forth herein, e.g. in relation to FIGS. 19-21, and in one embodiment can be coupled to a defined photodetector structure as set forth in reference to FIGS. 19-21. Wiring assembly 906 can include one or more wiring level e.g. M1, M2, V1 as set forth herein. In one embodiment, structure 10 that includes layers of photonic elements embedded in the bonded wafer assembly can host waveguiding features that can be waveguiding layers formed of silicon nitride or silicon.

In another embodiment, photonic structure 10 that includes layers of photonic elements embedded in the bonded wafer assembly shown in the example of FIG. 22 can include waveguiding features defined by waveguiding layers formed of low-temperature silicon nitride (PECVD) or silicon (using long-chain precursors) on either wafer where temperatures were limited to those of metal processing. In one embodiment, photonic structure 10 that includes layers of photonic elements embedded in the bonded wafer assembly can include silicon nitride photonics elements, e.g., defined by waveguiding layer 310 formed of silicon nitride near the bonding interface if optical coupling from handle to bonded portion is desired. Mode confinement in silicon nitride can be reduced, thus allowing relaxed bonding alignment and cladding layer thickness control compared to a silicon waveguide core.

In one embodiment, fabrication of a photonic structure 10 having photonic elements embedded in the bonded assembly can include the removal of films of high refractive index (e.g., silicon nitride or nitrogen-rich SiC) from areas in the optical vicinity (typically from about 1 µm to about 10 µm) surrounding said embedded photonics elements, on both the handle and bonding portion. Furthermore, by way of altering the lithography mask design, fill and other shapes of the respective wiring levels are eliminated from areas in the optical vicinity (typically from about 1 µm to about 10 µm) surrounding said embedded photonics elements, on both the handle and bonding portion.

In one embodiment, photonic structure 10 that includes photonic elements embedded in a bonded assembly can be subjected during the fabrication process to low-temperature line-edge roughness mitigation treatments, such as high-pressure oxidation followed by wet chemical oxide etching.

A small sample of methods apparatus and systems herein include the following.

A1. A method of fabricating a photonic structure comprising: forming a stack of hardmask material over a layer of waveguiding material; depositing a stack of organic lithography material over the stack of hardmask materials; and patterning the stack of organic lithography material, wherein the patterning includes stopping at the stack of hardmask material. A2. The method of A1, wherein the method includes patterning waveguide features in the layer of waveguiding material using the stack of organic lithography material. A3. The method of A1, wherein the patterning includes using reactive ion etching and wherein the method includes cleaning formed residue formed by the reactive ion etching. A4. The method of A1, wherein the patterning includes using reactive ion etching, wherein the method includes cleaning residue formed by the reactive ion etching, wherein the method includes patterning waveguide features in the layer of waveguiding material using the stack of organic material, and wherein the cleaning is performed subsequent to the patterning.

B1. A photonic structure comprising: a plurality of photonic layers formed of a waveguiding material; wherein the plurality of photonic layers includes a first photonic layer and a second photonic layer; and one or more waveguide defined by each of the first photonic layer and the second photonic layer. B2. The photonic structure of B1, wherein the first photonic layer and the second photonic layer are formed of different waveguiding materials. B3. The photonic structure of B2, wherein each of the first photonic layer and the second photonic layer is formed of a waveguiding material selected from the group consisting of crystalline silicon, poly-crystalline silicon, amorphous silicon, and silicon nitride. B4. The photonic structure of B1, wherein the first photonic layer and the second photonic layer are formed of a common waveguiding material. B5. The photonic structure of B1, wherein each of the first photonic layer and the second photonic layer is formed of a waveguiding material selected from the group consisting of crystalline silicon, poly-crystalline silicon, amorphous silicon, and silicon nitride. B6. The photonic structure of B1, wherein the first photonic layer and the second photonic layer are formed of different waveguiding material and are formed at different elevations. B7. The photonic structure of B1, wherein the first photonic layer and the second photonic layer are formed of different waveguiding material and wherein the first photonic layer and the second photonic layer are at a common elevation. B8. The photonic structure of B7, wherein a bottom elevation of the first photonic layer and a bottom elevation of the second photonic layer are formed at a common elevation. B9. The photonic structure of B1, wherein the photonic structure includes an inter-level dielectric layer separating the first photonic layer and the second photonic layer. B10. The photonic structure of B1, wherein the one or more waveguide is of a geometry selected from the group consisting of a rectangular geometry and a ridge geometry. B11. The photonic structure of B1, wherein the first photonic layer is at an elevation below the second photonic layer. B12. The photonic structure of B1, wherein the first photonic layer is at an elevation above the second photonic layer. B13. The photonic structure of B1, wherein the photonic structure is further characterized by a feature selected from the group consisting of: (a) first and second waveguides of different minimum thicknesses are defined in the first photonic layer, (b) a first waveguide having a first minimum thicknesses is defined by the first photonic layer and a second waveguide having a second minimum thickness is defined by the second photonic layer; (c) waveguides of different geometries are defined by the first photonic layer; (d) a first waveguide of a first geometry is defined by the first photonic layer and a second waveguide of a second geometry is defined by the second photonic layer. B14. The photonic structure of B1, wherein the plurality of photonic layers includes the first photonic layer, the second photonic layer, a third photonic layer and fourth photonic layer. B15. The photonic structure of B1, wherein the plurality of photonic layers includes the first photonic layer, the second photonic layer, a third photonic layer and fourth photonic layers, and wherein each of the first photonic layer, the second photonic layer, the third photonic layer and the fourth photonic layer is formed at a different elevation.

C1. A photonic structure comprising: a photonic layer and one or more waveguide defined by the photonic layer, wherein the photonic structure includes a feature selected from the group consisting of (a) first and second waveguides of different minimum thicknesses are defined in the photonic layer and (b) waveguides of different geometries are defined by the photonic layer. C2. The photonic structure of C1, wherein the photonic layer is formed of a waveguiding material selected from the group consisting of crystalline silicon, poly-crystalline silicon, amorphous silicon, and silicon nitride.

D1. A method of fabricating a photonic structure comprising: patterning a first waveguide in a first photonic layer, the first photonic layer formed of a first waveguiding material; and forming a dielectric layer about the first waveguide. D2. The method of D1, wherein dielectric material of the dielectric layer includes a plasma-enhanced deposited oxide. D3. The method of D1, wherein the forming includes using plasma enhanced chemical vapor deposition (PECVD). D4. The method of D1, wherein the forming includes forming plasma-enhanced oxide material over the first photonic layer so that the plasma enhanced oxide material preferentially deposits on horizontal surfaces with suppressed deposition rates on vertical surface proximate feature edges, resulting in an overall non-conformal film topography. D5. The method of D1, wherein the forming includes applying process conditions for deposition of non-conformal oxide material deposition in a manner to provide void-minimized filling of minimum feature size gaps. D6. The method of D1, wherein the method includes planarizing the dielectric layer to provide processing planarity for further layers. D7. The method of D1, wherein the method includes forming a second dielectric layer above the dielectric layer to provide corrected dielectric separation distance to one or more additional waveguiding layer.

E1. A method of fabricating a photonic structure comprising: patterning a first waveguide in a first layer, the first layer formed of a first waveguiding material. E2. The method of E1, wherein processing of waveguiding layers and layers above the one or more waveguiding levels include: removal of silicon nitride material in an optical vicinity of waveguides and other photonic elements using lithography, etching, and cleaning; removal of nitrogen-rich silicon carbide material in the optical vicinity of waveguides and other photonic elements using lithography, etching, and cleaning; omission in mask design of filling features in each waveguiding layer; omission in mask design of filling features in each metal wiring layer; omission in mask design of filling features in each connecting metal via layer. E3. The method of E1, wherein the first waveguiding material is silicon, and wherein the method includes performing line edge roughness treatment of the first waveguide using $H_2$ annealing. E4. The method of E3, wherein the $H_2$ annealing is performed at a temperature of between about 700 degrees Celsius and about 950 degrees Celsius.

F1. A method of fabricating a photonic structure comprising: depositing a layer formed of nitride waveguiding material; and patterning the layer formed of nitride waveguiding material to define a waveguide, wherein the depositing includes using plasma-enhanced chemical vapor deposition. F2. The method of F1, wherein the method includes performing treatment of the layer formed of nitride waveguiding material for correction of one or more or contamination, inclusions, voids, or non-stoichiometries, wherein the treatment is selected from the group consisting of thermal annealing or exposure to radiation. F3. The method of F1, wherein the method further includes planarizing and smoothing the layer formed of nitride waveguiding material. F4. The method of F1, further comprising depositing a non-conformal high-aspect-ratio gap-filling dielectric material over the waveguide. F5. The method of F1, wherein the depositing a layer includes using PECVD.

G1. A method of fabricating a photodetector structure comprising: forming dielectric material over a silicon waveguide; etching a trench in the dielectric material extending to the silicon waveguide; epitaxially growing germanium within the trench; annealing germanium formed by the epitaxially growing; repeating the epitaxially growing and the annealing until the germanium overfills the trench; planarizing an overfill portion of the germanium; and creating top and bottom contacts using ion implantation and metallization. G2. The method of G1, wherein the epitaxially growing is performed so that germanium is formed on the silicon waveguide. G3. The method of G1, wherein the epitaxially growing is performed so that the photodetector structure is absent a low-temperature SiGe or Ge buffer structure adjacent to the silicon waveguide. G5. The method of G1, wherein the epitaxially growing of germanium is performed without use of a doping gas so that intrinsic germanium is formed by the epitaxially growing. G6. The method of G1, wherein the epitaxially growing of germanium is performed using a dopant precursor so that in-situ doped germanium is formed by the epitaxially growing. G7. The method of G1, wherein the epitaxially growing includes performing epitaxial growing at a temperature in the range of from about 550 to about 850 degree Celsius. G8. The method of G1, wherein the epitaxially growing includes performing epitaxial growing at a temperature in the range of from about 550 to about 850 degree Celsius and wherein the annealing includes annealing at a temperature of between about 650 degrees Celsius to about 850 degrees Celsius. G9. The method of G1, wherein the epitaxially growing includes performing epitaxial growing at a temperature in the range of from about 550 to about 850 degree Celsius at a pressure in the range of from about 10 Torr to about 300 Torr using germane ($GeH_4$) and $H_2$ as a precursor and carrier gas, and wherein the annealing includes annealing at a temperature of between about 650 degrees Celsius to about 850 degrees Celsius at a pressure of between about 100 Torr to about 600 Torr. G10. The method of G1, wherein the growing is preceded by an ex-situ wet-chemical and an in-situ dry cleaning process for removal of organic and metallic contamination and native oxide. G11. The method of G1, wherein the growing is further preceded by an in-situ thermal treatment in a reducing $H_2$-environment for removal of sub-stoiciometric surface silicon oxide. G12. The method of G1, wherein the method includes performing a shallow top contact ion implantation and depositing a capping oxide. G13. The method of G1, wherein the method includes forming a reduced area ion implantation region spaced apart from an oxide trench. G14. The method of G1, wherein the method includes forming a reduced area shallow top ion implantation spaced apart from an oxide trench so that there is defined spacing distance between a perimeter of the germanium and a perimeter of the ion implantation. G15. The method of G1, wherein the method includes forming a reduced area shallow top implantation region spaced apart from an oxide trench by a spacing distance equal to or greater than a threshold distance. G16. The method of G1, wherein the method includes forming a reduced area top metal contact that is fully contained in a top ion implant region.

H1. A photonic structure comprising: a waveguide; a germanium formation formed on the waveguide; a first ion implantation region and a second ion implantation region, the second ion implantation region being of opposite polarity to the first ion implantation region to form a p-i-n or n-i-p formation. H2. The photonic structure of H1, wherein the photonic structure is absent of a low-temperature SiGe or Ge buffer between the waveguide and the germanium formation. H3. The photonic structure of H1, wherein the first ion implantation region is formed in the germanium formation. H4. The photonic structure of H1, wherein the second ion implantation region is formed in the waveguide. H5. The photonic structure of H1, wherein the second ion implantation region is formed in the waveguide and in the germanium formation.

I1. A photonic structure comprising: a waveguide; dielectric material formed over the waveguide; a trench formed in the dielectric material extending to the waveguide; a germanium formation formed in the trench; and an ion implantation region formed in an area of the germanium formation so that the ion implantation region is spaced from the trench by a spacing distance equal to or greater than a threshold distance. I2. The photonic structure of I1, wherein an entire perimeter of the ion implantation region is spaced from the trench by a spacing distance equal to or greater than a threshold distance. I3. The photonic structure of I1, wherein the threshold distance is 750 nm. I4. The photonic structure of I1, further comprising a contact formed on the ion implantation region in an area of the ion implantation region so that the contact is spaced from a perimeter of the ion implantation region by a spacing distance that is equal to or greater than a threshold distance. I5. The photonic structure of I1, further comprising a contact formed on the ion implantation region in an area of the ion implantation region so that an entire perimeter of the contact is spaced from a perimeter of the ion implantation region by a spacing distance that is equal to or greater than a threshold distance.

J1. A photonic structure comprising: a waveguide having an ion implantation region; a germanium formation adapted to receive light transmitted by the waveguide; an oppositely doped ion implantation region formed on the germanium formation; a silicide formation formed on the ion implantation region of the waveguide; a conductive material formation formed on the silicide formation; and a conductive material formation formed on the germanium formation. J2. The photonic structure of J1, wherein the conductive material formation formed on the germanium formation is a germanide-free (refractory) conductive material formation. J3. The photonic structure of J1, comprising dielectric material formed over the waveguide, and a trench formed in the dielectric material, wherein the silicide formation and the conductive material formation are formed in the trench. J4. The photonic structure of J1, comprising dielectric material formed over the germanium formation, and a trench formed in the dielectric material, wherein the conductive material formation is formed in the trench.

K1. A photonic structure comprising: a wiring level having a conductive material formation that defines a wiring assembly, wherein the conductive material formation is formed of a metallization material; and a waveguiding layer; wherein the waveguiding layer is formed at an elevation of the photonic structure that is in common with or higher than an elevation of the wiring level. K2. The photonic structure of K1, wherein the conductive material formation is formed of a metallization material that is adapted to reflect light at wavelengths within a communication band of wavelengths of from about 1.3 µm to about 1.55 µm. K2. The photonic structure of K1, wherein the conductive material formation is formed of a metallization material that is adapted to reflect light at wavelengths within a band of wavelengths of from about 900 nm to about 1600 nm. K3. The photonic structure of K1, wherein the waveguiding layer is formed of silicon nitride. K4. The photonic structure of K1, wherein the waveguiding layer is formed of silicon nitride deposited using plasma enhanced chemical vapor deposition. K5. The photonic structure of K1, wherein the waveguiding layer is formed at an elevation higher than an elevation of the wiring level. K6. The photonic structure of K1, wherein the waveguiding layer is formed at an elevation higher than an elevation of the wiring level and includes a first patterned section patterned to define one or more waveguide and a second section aligned to the conductive material formation. K7. The photonic structure of K1, wherein the waveguiding layer is formed at an elevation higher than an elevation of the wiring level and includes a first patterned section patterned to define one or more waveguide and a second section aligned to the conductive material formation so that the second section functions as a protect layer for the conductive material formation.

L1. A method of fabricating a photodetector structure comprising: forming dielectric material over silicon; etching a trench in the dielectric material extending to the silicon; epitaxially growing germanium within the trench; annealing germanium formed by the epitaxially growing; repeating the epitaxially growing and the annealing until the germanium overfills the trench; planarizing an overfill portion of the germanium; and creating top and bottom contacts using doping and metallization. L2. The method of L1, wherein the epitaxially growing is performed so that germanium is formed on the silicon. L3. The method of L1, wherein the epitaxially growing is performed so that the photodetector structure is absent a low-temperature SiGe or Ge buffer structure adjacent to the silicon. L4. The method of L1, wherein the epitaxially growing of germanium is performed without use of a doping gas so that intrinsic germanium is formed by the epitaxially growing. L5. The method of L1, wherein the epitaxially growing of germanium is performed using a dopant precursor so that in-situ doped germanium is formed by the epitaxially growing. L6. The method of L1, wherein the epitaxially growing includes performing epitaxial growing at the range of from about 550 to about 850 degree Celsius. L7. The method of L1, wherein the epitaxially growing includes performing epitaxial growing at a temperature in the range of from about 550 to about 850 degree Celsius and wherein the annealing includes annealing at a temperature of between about 650 degrees Celsius to about 850 degrees Celsius. L8. The method of L1, wherein the epitaxially growing includes performing epitaxial growing at a temperature in the range of from about 550 to about 850 degree Celsius at a pressure in the range of from about 10 Torr to about 300 Torr using germane (GeH4) and H2 as a precursor and carrier gas, and wherein the annealing includes annealing at a temperature of between about 650 degrees Celsius to about 850 degrees Celsius at a pressure of between about 100 Torr to about 600 Torr. L9. The method of L1, wherein the growing is preceded by an ex-situ wet-chemical and an in-situ dry cleaning process for removal of organic and metallic contamination and native oxide. L10. The method of L1, wherein the growing is further preceded by an in-situ thermal treatment in a reducing H2-environment for removal of sub-stoiciometric surface silicon oxide. L11. The method of L1, wherein the method includes performing a shallow top contact doping region and depositing a capping oxide. L12. The method of L1, wherein the method includes forming a reduced area doping region spaced apart from an oxide trench. L13. The method of L1, wherein the method includes forming a reduced area shallow top doping region spaced apart from an oxide trench so that there is defined spacing distance between a perimeter of the germanium and a perimeter of a doping region. L14. The method of L1, wherein the method includes forming a reduced area shallow top doping region spaced apart from an oxide trench by a spacing distance equal to or greater than a threshold distance. L15. The method of L1, wherein the method includes forming a reduced area top metal contact that is fully contained in a top doping region. L16. The method of L1, wherein the photonic structure is absent of a low-temperature SiGe or Ge buffer between the silicon and the germanium formation.

M1. A photonic structure comprising: dielectric material formed over silicon; a trench formed in the dielectric material extending to the silicon; a germanium formation formed in the trench; and a doping region formed in an area of the germanium formation so that the doping region is spaced from the trench by a spacing distance equal to or greater than a threshold distance. M2. The photonic structure of M1, wherein an entire perimeter of the doping region is spaced from the trench by a spacing distance equal to or greater than a threshold distance. M3. The photonic structure of M1, wherein the threshold distance is selected from the group consisting of (a) 200 nm to 1000 nm and (b) 750 nm. M4. The photonic structure of M1, wherein the threshold distance is 750 nm. M5. The photonic structure of M1, further comprising a contact formed on the doping region in an area of the doping region so that the contact is spaced from a perimeter of the doping region by a spacing distance that is equal to or greater than a threshold distance. M6. The photonic structure of M1, further comprising a contact formed on the doping region in an area of the doping region so that an entire perimeter of the contact is spaced from a perimeter of the doping region by a spacing distance that is equal to or greater than a threshold distance.

N1. A photonic structure comprising: silicon having a doping region; a germanium formation adapted to receive light transmitted by the silicon; an oppositely doped doping region formed on the germanium formation; a silicide formation formed on the doping region of the silicon; a conductive material formation formed on the silicide formation; and a conductive material formation formed on the germanium formation. N2. The photonic structure of N1, wherein the conductive material formation formed on the germanium formation is a germanide-free (refractory) conductive material formation.

O1. A method of fabricating a photonic structure comprising: depositing a layer formed of nitride waveguiding material; and patterning the layer formed of nitride waveguiding material to define photonic features, wherein the depositing includes using plasma-enhanced chemical vapor deposition. O2. The method of O1, wherein the method includes performing treatment of the layer formed of nitride waveguiding material for correction of one or more or contamination, inclusions, voids, or non-stoichiometries, wherein the treatment is selected from the group consisting of thermal annealing and exposure to radiation. O3. The method of O1, wherein the method further includes planarizing and smoothing the layer formed of nitride waveguiding material. O4. The method of O1, further comprising depositing a non-conformal high-aspect-ratio gap-filling dielectric material over the waveguide.

P1. A method comprising: depositing a metal within a trench, the trench having a bottom formed of silicon and sidewalls formed of dielectric material; performing silicide formation annealing so that metal reacts with the silicon to form a silicide formation at the bottom of the trench; performing transformation stage annealing so that the silicide formation is transformed into a low resistivity phase. P2. The method of P1, wherein the depositing a metal results in unreacted metal being formed on the sidewalls, and wherein the method includes forming a capping layer over the unreacted metal prior to the performing silicide formation annealing. P3. The method of P1, wherein the depositing a metal results in unreacted metal being formed on the sidewalls, wherein the method includes forming a capping layer over the unreacted metal prior to the performing silicide formation annealing, and wherein the method includes removing the capping layer and the unreacted metal prior to the performing transformation stage annealing. P4. The method of P1, wherein the transformation stage annealing is performed at a higher annealing temperature than the silicide formation annealing. P5. The method of P1, wherein the metal is selected from the group consisting of nickel and nickel platinum. P6. The method of P1, wherein the depositing a metal is followed by a second metal deposition overfilling the trench so that the second metal has a thickness at a top of the trench that is multiple times a desired thickness at a bottom of the trench. P7. The method of P1, wherein the depositing a metal is followed by a second metal deposition overfilling the trench so that the second metal has a thickness at a top of the trench that is more than three times a desired thickness at a bottom of the trench. P8. The method of P1, wherein the method of depositing a second metal includes forming copper within the trench subsequent to formation of the silicide formation (first metal).

Q1. A method of forming a photonic structure comprising: forming a photodetector having a bottom and top contact; forming a dielectric layer defining a trench over the top contact; forming an aluminum metallization layer within the trench, the aluminum metallization layer being in communication with the top contact. Q2. The method of Q1, wherein the method includes subjecting the aluminum metallization layer to processing so that the aluminum metallization layer defines a termination layer. Q3. The method of Q1, wherein the method includes using a damascene process to form the aluminum metallization layer, and wherein the method is performed so that the aluminum metallization layer defines an aluminum termination over a copper conductive material formation. Q4. The method of Q1, wherein the forming an aluminum metalization layer includes depositing aluminum using a process selected from the group consisting of physical vapor deposition (PVD), chemical vapor deposition (CVD) and evaporation. Q5. The method of Q1, wherein the method includes performing a low temperature anneal to densify, reflow, or recrystallize the aluminum metallization layer. Q6. The method of Q1, wherein the method includes performing a moderate temperature aluminum metallization compatible with existing (Cu) metallization formations. Q7. The method of Q1, wherein the method includes subjecting the aluminum metallization layer to processing to define a contact pad. Q8. The method of Q1, wherein the method includes planarizing the aluminum metalization layer so that the aluminum metallization layer defines a flat wiring assembly. Q9. The method of Q1, wherein the method includes performing a dual-patterning and single fill/planarization process where the aluminum metallization layer simultaneously fills the trench and a via below the trench, and wherein the method includes planarizing the aluminum metallization layer.

R1. A method of fabricating a photonic structure comprising: forming a stack of hardmask material over a layer of waveguiding material; depositing a stack of organic lithography material over the stack of hardmask materials; and patterning the stack of organic lithography material, wherein the patterning includes stopping at the stack of hardmask material. R2. The method of R1, wherein the stack of hardmask material includes silicon dioxide. R3. The method of R1, wherein the method includes patterning photonic features (in the layer of waveguiding material using the stack of organic lithography material. R4. The method of R1, wherein the patterning includes using reactive ion etching and wherein the method includes cleaning residue formed by the reactive ion etching. R5. The method of R1, wherein the patterning includes using reactive ion etching, wherein the method includes cleaning residue formed by the reactive ion etching, wherein the method includes patterning photonic features in the layer of waveguiding material using the stack of organic lithography material, and wherein the cleaning is performed subsequent to the patterning.

S1. A method of fabricating a photonic structure comprising: patterning a first set of photonic features in a first photonic layer, the first photonic layer formed of a first waveguiding material; and forming a dielectric layer about the first set of photonic features, wherein dielectric material of the dielectric layer includes a plasma-enhanced oxide. S2. The method of S1, wherein the forming includes using plasma enhanced chemical vapor deposition (PECVD), and wherein the method includes forming a second dielectric layer above the dielectric layer to provide corrected dielectric separation distance to one or more additional waveguiding layer. S3. The method of S1, wherein the forming includes using plasma enhanced chemical vapor deposition (PECVD). S4. The method of S1, wherein the forming includes forming plasma-enhanced oxide material over the first photonic layer so that the plasma-enhanced oxide material preferentially deposits on horizontal surfaces with suppressed deposition rates on vertical surface proximate feature edges, resulting in an overall non-conformal film topography. S5. The method of S1, wherein the forming includes applying process conditions for deposition of non-conformal oxide material deposition in a manner to provide void-minimized filling of minimum feature size gaps. S6. The method of S1, wherein the method includes planarizing the dielectric layer to provide processing planarity for further layers. S7. The method of S1, wherein the method includes forming a second dielectric layer above the dielectric layer to provide corrected dielectric separation distance to one or more additional waveguiding layer.

T1. A method of fabricating a photonic structure comprising: forming a plurality of photonic layers; wherein the plurality of photonic layers includes a first photonic layer and a second photonic layer; and patterning the first photonic layer and the second photonic layer so that each of the first photonic layer and the second photonic layer defines one or more set of photonic features. T2. The method of T1, wherein the first photonic layer and the second photonic layer are formed of different waveguiding materials. T3. The method of T2, wherein each of the first photonic layer and the second photonic layer is formed of a waveguiding material selected from the group consisting of crystalline silicon, poly-crystalline silicon, amorphous silicon, silicon nitride, and silicon oxynitride. T4. The method of claim T1, wherein each of the first photonic layer and the second photonic layer is formed of a waveguiding material selected from the group consisting of crystalline silicon, poly-crystalline silicon, amorphous silicon, silicon nitride, and silicon oxynitride. T5. The method of claim T1, wherein the first photonic layer and the second photonic layer are formed of different waveguiding material and are formed at different elevations. T6. The method of claim T1, wherein the first photonic layer and the second photonic layer are formed of different waveguiding material and wherein the first photonic layer and the second photonic layer are at a common elevation. T7. The method of claim T1, wherein a bottom elevation of the first photonic layer and a bottom elevation of the second photonic layer are formed at a common elevation. T8. The method of claim T1, wherein the first photonic layer is at an elevation below the second photonic layer. T9. The method of claim T1, wherein the plurality of photonic layers includes the first photonic layer, the second photonic layer, a third photonic layer and a fourth photonic layer. T10. The method of claim T1, wherein the plurality of photonic layers includes the first photonic layer, the second photonic layer, a third photonic layer and fourth photonic layers, and wherein each of the first photonic layer, the second photonic layer, the third photonic layer and the fourth photonic layer is formed at a different elevation.

U1. A method of fabricating a photonic structure comprising: forming a photonic layer; and patterning the photonic layer to define one or more set of photonic features, wherein the method is characterized by one or more of the following selected from the group consisting of: (a) the method is performed so that first and second sets of photonic features of different minimum thicknesses are defined in the photonic layer and (b) the method is performed so that sets of photonic features of different geometries are defined by the photonic layer. U2. The method of claim 44, wherein the photonic layer is formed of a waveguiding material selected from the group consisting of, poly-crystalline silicon, amorphous silicon, silicon nitride, and silicon oxynitride.

V1. A photonic structure comprising: a wiring level having a conductive material formation that defines a wiring assembly, wherein the conductive material formation is formed of a metallization material; and a waveguiding layer patterned to define photonic features; wherein the waveguiding layer is formed at an elevation of the photonic structure that is in common with or higher than an elevation of the wiring level. V2. The photonic structure of claim V1, wherein the conductive material formation is formed of a metallization material that is adapted to reflect light at wavelengths within a communication band of wavelengths of from about 1.3 µm to about 1.55 µm. V3. The photonic structure of claim V1, wherein the conductive material formation is formed of a metallization material that is adapted to reflect light at wavelengths within a band of wavelengths of from about 900 nm to about 1600 nm. V4. The photonic structure of claim V1, wherein the waveguiding layer is formed of silicon nitride. V5. The photonic structure of claim V1, wherein the waveguiding layer is formed of a material selected from the group consisting of amorphous silicon and polysilicon. V6. The photonic structure of claim V1, wherein the waveguiding layer is formed of silicon nitride deposited using plasma enhanced chemical vapor deposition. V7. The photonic structure of claim V1, wherein the waveguiding layer is formed at an elevation higher than an elevation of the wiring level. V8. The photonic structure of claim V1, wherein the waveguiding layer is formed at an elevation higher than an elevation of the wiring level and includes a first patterned section patterned to define one or more set of photonic features and a second section aligned to the conductive material formation. V9. The photonic structure of claim V1, wherein the waveguiding layer is formed at an elevation higher than an elevation of the wiring level and includes a first patterned section patterned to define one or more set of photonic features and a second section aligned to the conductive material formation so that the second section functions as a protect layer for the conductive material formation.

W1. A photonic structure comprising: a first photonic feature; a second photonic feature; a third photonic feature; wherein the first photonic feature, the second photonic feature and the third photonic feature are at a common elevation; wherein one or more of the first second or third photonic feature is formed of a material other than monocrystalline silicon. W2. The photonic structure of claim W1, wherein each of the first photonic feature, second photonic feature and third photonic feature is formed of a material selected from the group consisting of monocrystalline silicon, polycrystalline silicon, amorphous silicon, silicon nitride, and silicon oxynitride.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by and relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a photodetector structure comprising:
   forming dielectric material over silicon;
   etching a trench in the dielectric material extending to the silicon;
   epitaxially growing germanium within the trench;
   annealing germanium formed by the epitaxially growing;
   repeating the epitaxially growing and the annealing until the germanium overfills the trench;
   planarizing an overfill portion of the germanium; and
   creating top and bottom contacts using doping and metallization, wherein the method is performed so that the top contact is in contact with the germanium, wherein the method includes forming a reduced area top doping region in the germanium having an area smaller than an area of a top of the germanium in which the top doping region is formed, and wherein the method is performed so that an entirety of a perimeter of the top doping region is spaced apart inward from a perimeter of the germanium defined at a top of the germanium.

2. The method of claim 1, wherein the epitaxially growing is performed so that germanium is formed on the-silicon.

3. The method of claim 1, wherein the epitaxially growing is performed so that the photodetector structure is absent a low-temperature SiGe or Ge buffer structure adjacent to the silicon.

4. The method of claim 1, wherein the epitaxially growing of germanium is performed without use of a doping gas so that intrinsic germanium is formed by the epitaxially growing.

5. The method of claim 1, wherein the epitaxially growing of germanium is performed using a dopant precursor so that in-situ doped germanium is formed by the epitaxially growing.

6. The method of claim 1, wherein the epitaxially growing includes performing epitaxial growing at a temperature in the range of from about 550 degrees Celsius to about 850 degrees Celsius.

7. The method of claim 1, wherein the epitaxially growing includes performing epitaxial growing at a temperature in the range of from about 550 degrees Celsius to about 850 degrees Celsius and wherein the annealing includes annealing at a temperature of between about 650 degrees Celsius to about 850 degrees Celsius.

8. The method of claim 1, wherein the epitaxially growing includes performing epitaxial growing at a temperature in the range of from about 550 degrees Celsius to about 850 degrees Celsius at a pressure in the range of from about 10 Torr to about 300 Torr using germane ($GeH_4$) and $H_2$ as a precursor and carrier gas, and wherein the annealing includes annealing at a temperature of between about 650 degrees Celsius to about 850 degrees Celsius at a pressure of between about 100 Torr to about 600 Torr.

9. The method of claim 1, wherein the growing is preceded by an ex-situ wet-chemical and an in-situ dry cleaning process for removal of organic and metallic contamination and native oxide.

10. The method of claim 1, wherein the growing is further preceded by an in-situ thermal treatment in a reducing $H_2$-environment for removal of sub-stoiciometric surface silicon oxide.

11. The method of claim 1, wherein the method is performed so that the top contact is in contact with the germanium and further so that an entirety of a perimeter of the top contact at a location contacting the germanium is spaced apart from a perimeter of the germanium defined at a top of the germanium.

12. The method of claim 1, wherein the method is performed so that a top doping region is formed in the germanium and wherein the method is performed so that the top contact is in contact with the germanium by being in contact with the top doping region of the germanium and further so that an entirety of a perimeter of the top contact at a location contacting the top doping region of the germanium is spaced apart from a perimeter of the top doping region.

13. The method of claim 1, wherein the method is performed so that an entirety of a perimeter of the top doping region is spaced apart inward from a perimeter of the germanium defined at a top of the germanium and wherein the method is performed so that the top contact is in contact with the top doping region of the germanium and further so that an entirety of a perimeter of the top contact at a location contacting the top doping region of the germanium is spaced apart inward from the perimeter of the top doping region.

14. The method of claim 1, wherein the method includes forming a top doping region in the germanium and wherein the method is performed so that an entirety of a perimeter of the top doping region is spaced apart inward from a perimeter of the germanium defined at a top of the germanium and wherein the method is performed so that the top contact is in contact with the top doping region of the germanium and further so that an entirety of a perimeter of the top contact at a location contacting the top doping region of the germanium is spaced apart inward from the perimeter of the top doping region.

15. The method of claim 1, wherein the annealing germanium formed by the epitaxially growing is performed without reflow of the germanium.

16. The method of claim 1, wherein the repeating the epitaxially growing and the annealing until the germanium overfills the trench includes finalizing of the overfill with a growing rather than the annealing.

17. The method of claim 1, wherein each iteration of the epitaxially growing germanium within the trench increases a height of the germanium by less than 500 nm, and wherein the etching a trench includes performing the etching so that the trench has a width of less than about 10 um.

18. The method of claim 1, wherein the etching a trench includes etching a trench in the dielectric material extending to a top elevation of the silicon, and wherein the epitaxially growing includes epitaxially growing germanium within the trench so that a bottom elevation of the germanium is at the top elevation of the silicon.

19. The method of claim 1, wherein repeating the epitaxially growing and the annealing includes performing the repeating so that prior to the overfill and subsequent to each iteration of the annealing the germanium retains a defined formation characterized by a top elevation being at a center of the formation and lower elevations at a perimeter of the formation.

20. A method of fabricating a photodetector structure comprising:
   forming dielectric material over silicon;
   etching a trench in the dielectric material extending to the silicon;
   epitaxially growing germanium within the trench;
   annealing germanium formed by the epitaxially growing;
   repeating the epitaxially growing and the annealing until the germanium overfills the trench;
   planarizing an overfill portion of the germanium; and
   creating top and bottom contacts using doping and metallization, wherein the epitaxially growing includes performing the epitaxial growing so that initially deposited germanium formed on the silicon is epitaxially grown at a temperature in the range of from about 550 degrees Celsius to about 850 degrees Celsius.

21. The method of claim 20, wherein the method is performed so that the top contact is in contact with the germanium at a location that includes an area in alignment with a portion of the silicon that delimits the trench.

22. The method of claim 20, wherein the method includes forming a reduced area top doping region in the germanium having an area smaller than an area of a top of the germanium in which the top doping region is formed.

23. The method of claim 20, wherein the etching a trench includes etching a trench in the dielectric material extending to a top elevation of the silicon, and wherein the epitaxially growing includes epitaxially growing germanium within the trench so that a bottom elevation of the germanium is at the top elevation of the silicon.

24. The method of claim 20, wherein repeating the epitaxially growing and the annealing includes performing the repeating so that prior to the overfill and subsequent to each iteration of the annealing the germanium retains a defined formation characterized by a top elevation being at a center of the formation and lower elevations at a perimeter of the formation.

25. The method of claim 20, wherein the epitaxially growing includes using a variable temperature.

26. The method of claim 20, wherein the epitaxially growing is performed so that the photodetector structure is absent a low-temperature buffer structure adjacent to the silicon.

27. The method of claim 20, wherein the epitaxially growing is performed so that the germanium is formed directly on the silicon to form an epitaxially grown germanium formation and further so that the photodetector structure is absent a low-temperature buffer structure between the silicon and the epitaxially grown germanium formation.

28. The method of claim 20, wherein the method includes forming a reduced area shallow top doping region spaced apart from an oxide trench so that there is defined spacing distance between a perimeter of the germanium and a perimeter of a doping region, and wherein the oxide trench is the trench formed by the etching a trench in the dielectric material.

29. The method of claim 20, wherein the method is performed so that the top contact is in contact with the germanium, wherein the method includes forming a reduced area top doping region in the germanium having an area smaller than an area of a top of the germanium in which the top doping region is formed, and wherein the method is performed so that an entirety of a perimeter of the top doping region is spaced apart inward from a perimeter of the germanium defined at a top of the germanium.

30. The method of claim 20, wherein the method includes forming a top doping region in the germanium and wherein the method is performed so that an entirety of a perimeter of the top doping region is spaced apart inward from a perimeter of the germanium defined at a top of the germanium and wherein the method is performed so that the top contact is in contact with the top doping region of the germanium and further so that an entirety of a perimeter of the top contact at a location contacting the top doping region of the germanium is spaced apart inward from the perimeter of the top doping region.

31. The method of claim 20, wherein the method is performed so that the silicon includes a silicon portion delimiting the trench, and wherein the method is performed so that the top contact is in contact with the germanium at a location that includes an area in alignment with the silicon portion delimiting the trench.

32. A method of fabricating a photodetector structure comprising:
   forming dielectric material over silicon;
   etching a trench in the dielectric material extending to the silicon;
   epitaxially growing germanium within the trench;
   annealing germanium formed by the epitaxially growing;
   repeating the epitaxially growing and the annealing until the germanium overfills the trench;
   planarizing an overfill portion of the germanium; and
   creating top and bottom contacts using doping and metallization, wherein the method is performed so that the silicon includes a silicon portion delimiting the trench, and wherein the method is performed so that the top contact is in contact with the germanium at a location that includes an area in alignment with the silicon portion delimiting the trench.

33. The method of claim 32, wherein an entirety of a perimeter of the top contact at the location contacting the germanium is substantially uniformly disposed with respect to a perimeter of the germanium defined at a top of the germanium.

34. The method of claim 33, wherein the method is performed so that the top contact is in contact with the germanium by being in contact with a doping region of the germanium and wherein the method is performed so that the entirety of the perimeter of the top contact at the location contacting the germanium is substantially uniformly disposed with respect to a perimeter of the germanium by being substantially uniformly spaced apart from the perimeter of the germanium defined at a top of the germanium.

35. A method of fabricating a photodetector structure comprising:
   forming dielectric material over silicon;
   etching a trench in the dielectric material extending to the silicon;
   epitaxially growing germanium within the trench;
   annealing germanium formed by the epitaxially growing;
   repeating the epitaxially growing and the annealing until the germanium overfills the trench;
   planarizing an overfill portion of the germanium; and creating top and bottom contacts using doping and metallization, wherein the method includes forming a top doping region in the germanium and wherein the method is performed so that an entirety of a perimeter of the top doping region is spaced apart inward from a perimeter of the germanium defined at a top of the germanium and wherein the method is performed so that the top contact is in contact with the top doping region of the germanium and further so that an entirety of a perimeter of the top contact at a location contacting the top doping region of the germanium is spaced apart inward from the perimeter of the top doping region.

36. A method of fabricating a photodetector structure comprising:
forming dielectric material over silicon;
etching a trench in the dielectric material extending to the silicon;
epitaxially growing germanium within the trench;
annealing germanium formed by the epitaxially growing;
repeating the epitaxially growing and the annealing until the germanium overfills the trench;
planarizing an overfill portion of the germanium; and
creating top and bottom contacts using doping and metallization, wherein the epitaxially growing includes performing epitaxial growing at a temperature in the range of from about 550 degrees Celsius to about 850 degrees Celsius at a pressure in the range of from about 10 Torr to about 300 Torr using germane ($GeH_4$) and $H_2$ as a precursor and carrier gas, and wherein the annealing includes annealing at a temperature of between about 650 degrees Celsius to about 850 degrees Celsius at a pressure of between about 100 Torr to about 600 Torr.

* * * * *